United States Patent [19]
Wong

[11] Patent Number: 6,166,938
[45] Date of Patent: Dec. 26, 2000

[54] DATA ENCODING FOR CONTENT ADDRESSABLE MEMORIES

[75] Inventor: Sau-Ching Wong, Hillsborough, Calif.

[73] Assignee: SanDisk Corporation, Sunnyvale, Calif.

[21] Appl. No.: 09/315,807

[22] Filed: May 21, 1999

[51] Int. Cl.[7] .................................................. G11C 15/00
[52] U.S. Cl. .................. 365/49; 365/185.08; 365/189.07
[58] Field of Search .............................. 365/49, 185.08, 365/189.07, 189.08

[56] References Cited

U.S. PATENT DOCUMENTS

| | | | |
|---|---|---|---|
| 4,538,243 | 8/1985 | Zehner | 365/49 |
| 4,833,643 | 5/1989 | Hori | 365/49 |
| 4,890,260 | 12/1989 | Chuang et al. | 365/49 |
| 4,928,260 | 5/1990 | Chuang et al. | 365/49 |
| 5,034,919 | 7/1991 | Sasai et al. | 365/49 |
| 5,040,134 | 8/1991 | Park | 364/602 |
| 5,051,949 | 9/1991 | Young | 365/49 |
| 5,111,427 | 5/1992 | Kobayashi et al. | 365/49 |
| 5,226,005 | 7/1993 | Lee et al. | 365/49 |
| 5,258,946 | 11/1993 | Graf | 365/49 |
| 5,267,213 | 11/1993 | Sung et al. | 365/226 |
| 5,305,262 | 4/1994 | Yoneda | 365/49 X |
| 5,383,146 | 1/1995 | Threewitt | 365/49 |
| 5,386,379 | 1/1995 | Al-Yahia et al. | 365/49 |
| 5,396,449 | 3/1995 | Atallah et al. | 365/49 |
| 5,422,838 | 6/1995 | Lin | 365/49 |
| 5,453,948 | 9/1995 | Yoneda | 365/49 |
| 5,455,784 | 10/1995 | Yamada | 365/49 |
| 5,568,415 | 10/1996 | McLellan et al. | 365/49 |
| 5,619,446 | 4/1997 | Yoneda et al. | 365/49 |

(List continued on next page.)

OTHER PUBLICATIONS

Aragaki et al., "A High Density Multiple–Valued Content–Addressable Memory Based on One Transistor Cell," *IEICE Trans. Electron.*, vol. E76–C, No. 11, Nov. 1993, pp. 1649–1656.

Ghose and Dharmaraj, "Response Pipelined CAM Chips: The First Generation and Beyond," *The 7th Int'l Conference on VLSI Design*, Jan. 5–8, 1994, pp. 365–368.

Glaise and Munier, "A Low Cost Searching Device for an ATM Adapter," *The 6th Int'l Conference on Computer Communications and Networks*, Sep. 22–25, 1997, pp. 488–493.

Hanyu et al., "Design of a One–Transistor–Cell Multiple–Valued CAM," *IEEE Journal of Solid–State Circuits*, vol. 31, No. 11, Nov. 1996, pp. 1669–1674.

Hanyu et al., "2–Transistor–Cell 4–Valued Universal–Literal CAM for a Cellular Logic Image Processor," *1997 IEEE Int'l Solid–State Circuits Conference, Digest of Technical Papers*, First Edition, Feb. 1997, pp. 46–47 and 427.

(List continued on next page.)

*Primary Examiner*—Huan Hoang
*Attorney, Agent, or Firm*—Majestic, Parsons, Siebert & Hsue

[57] ABSTRACT

Input partitioning logic is coupled to bit-lines of a content addressable memory (CAM) array having four-transistor (4-T) non-volatile Flash CAM cells. Prior to a program or search operation on the 4-T Flash CAM cells, two input data bits and their complements are applied to the input partitioning logic, which can be two-input NAND, NOR, AND, or OR gates. By selecting the appropriate values for the input bits, individual ones of the memory cells in the 4-T CAM cell can be programmed, or a desired two-bit pattern can be searched. The use of input partitioning logic prior to applying the search and program voltages to the bit-lines of the CAM cell results in substantially less voltage transitions during searches and less required programming current because fewer Flash memory cells are required to be programmed. Consequently, power consumption while operating the CAM array is substantially reduced, and the Flash memory cell endurance is effectively increased. Global masking techniques can be effectively applied to the input partitioning logic. These same techniques can also be used for DRAM-based CAM cells.

37 Claims, 12 Drawing Sheets

U.S. PATENT DOCUMENTS

| | | | |
|---|---|---|---|
| 5,642,114 | 6/1997 | Komoto et al. | 365/49 X |
| 5,787,458 | 7/1998 | Miwa | 711/108 |
| 5,828,593 | 10/1998 | Schultz et al. | 365/49 |
| 5,859,791 | 1/1999 | Schultz et al. | 365/49 |
| 5,890,201 | 3/1999 | McLellan et al. | 711/108 |
| 5,940,852 | 8/1999 | Rangasayee et al. | 711/108 |
| 5,949,696 | 7/1999 | Threewitt | 365/49 |

OTHER PUBLICATIONS

Hanyu et al., "One–Transistor–Cell 4–Valued Universal–Literal CAM for Cellular Logic Image Processing," *The 27th Int'l Symposium on Multiple–Valued Logic*, May 28–30, 1997, pp. 175–180.

Hanyu et al., "Multiple–Valued Floating–Gate–MOS Pass Logic and Its Application to Logic–in–Memory VLSI," *The 28th Int'l Symposium on Multiple–Valued Logic*, May 27–29, 1998, pp. 270–275.

Jamil, "RAM versus CAM," *IEEE Potentials*, vol. 16, No. 2, Apr./May 1997, pp. 26–29.

Kramer et al., "55GCPS CAM Using 5b Analog Flash," *1997 IEEE Int'l Solid–State Circuits Conference, Digest of Technical Papers*, First Edition, Feb. 1997, pp.44–45 and 427.

Miwa et al., "A 1Mb 2–Transistor/bit Non–Volatile CAM Based on Flash–Memory Technologies," *1996 IEEE Int'l Solid–State Circuits Conference, Digest of Technical Papers*, First Edition, Feb. 1996, pp. 40–41 and 414.

Miwa et al., "A 1–Mb 2–Tr/b Nonvolatile CAM Based on Flash Memory Technologies," *IEEE Journal of Solid–State Circuits*, vol. 31, No. 11, Nov. 1996, pp. 1601–1609.

Schultz and Gulak, "CAM–Based Single–Chip Shared Buffer ATM Switch," *IEEE Int'l Conference on Communications*, May 1–5, 1994, pp. 1190–1195.

Schultz and Gulak, "Fully–Parallel Multi–Megabit Integrated CAM/RAM Design," *IEEE Int'l Workshop on Memory Technology, Design and Testing*, Aug. 8–9, 1994, pp. 46–51.

Schultz and Gulak, "Fully Parallel Integrated CAM/RAM Using Preclassification to Enable Large Capacities," *IEEE Journal of Solid–State Circuits*, vol. 31, No. 5, May 1996, pp. 689–699.

Shafai et al., "Fully Parallel 30–MHz, 2.5–Mb CAM," *IEEE Journal of Solid–State Circuits*, vol. 33, No. 11, Nov. 1998 pp. 1690–1696.

Wade and Sodini, "A Ternary Content Addressable Search Engine," *IEEE Journal of Solid–State Circuits*, vol. 24, No. 4, Aug. 1989, pp. 1003–1013.

Yamagata et al., "A 288–kb Fully Parallel Content Addressable Memory Using a Stacked–Capacitor Cell Structure," *IEEE Journal of Solid–State Circuits*, vol. 27, No. 12, Dec. 1992, pp. 1927–1933.

Yamagata et al., "A Bitline Control Circuit Scheme and Redundancy Technique for High–Density Dynamic Content Addressable Memories," *IEICE Trans. Electron.*, vol. E76–C, No. 11, Nov. 1993, pp. 1657–1664.

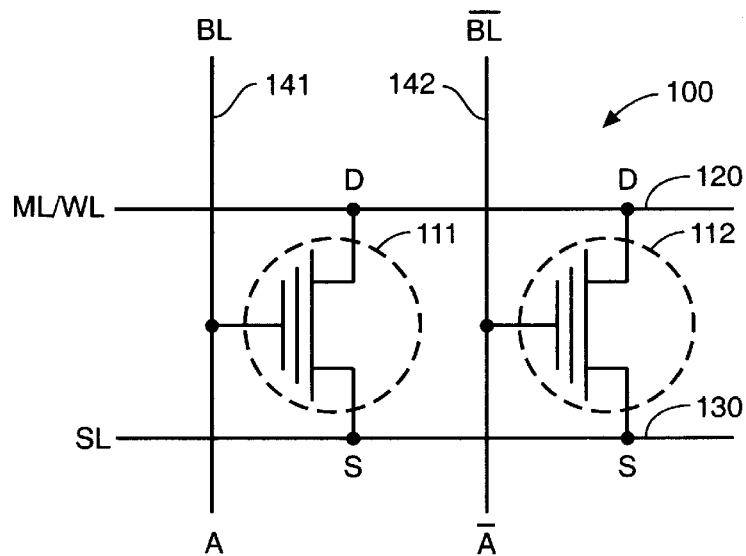
FIG._1A
(PRIOR ART)
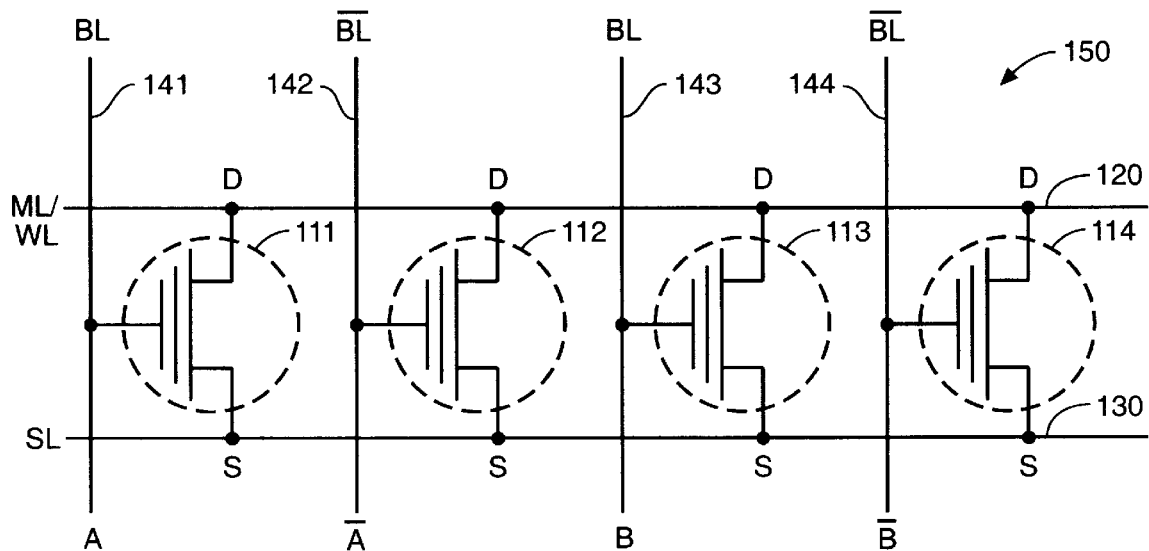
FIG._1B
(PRIOR ART)

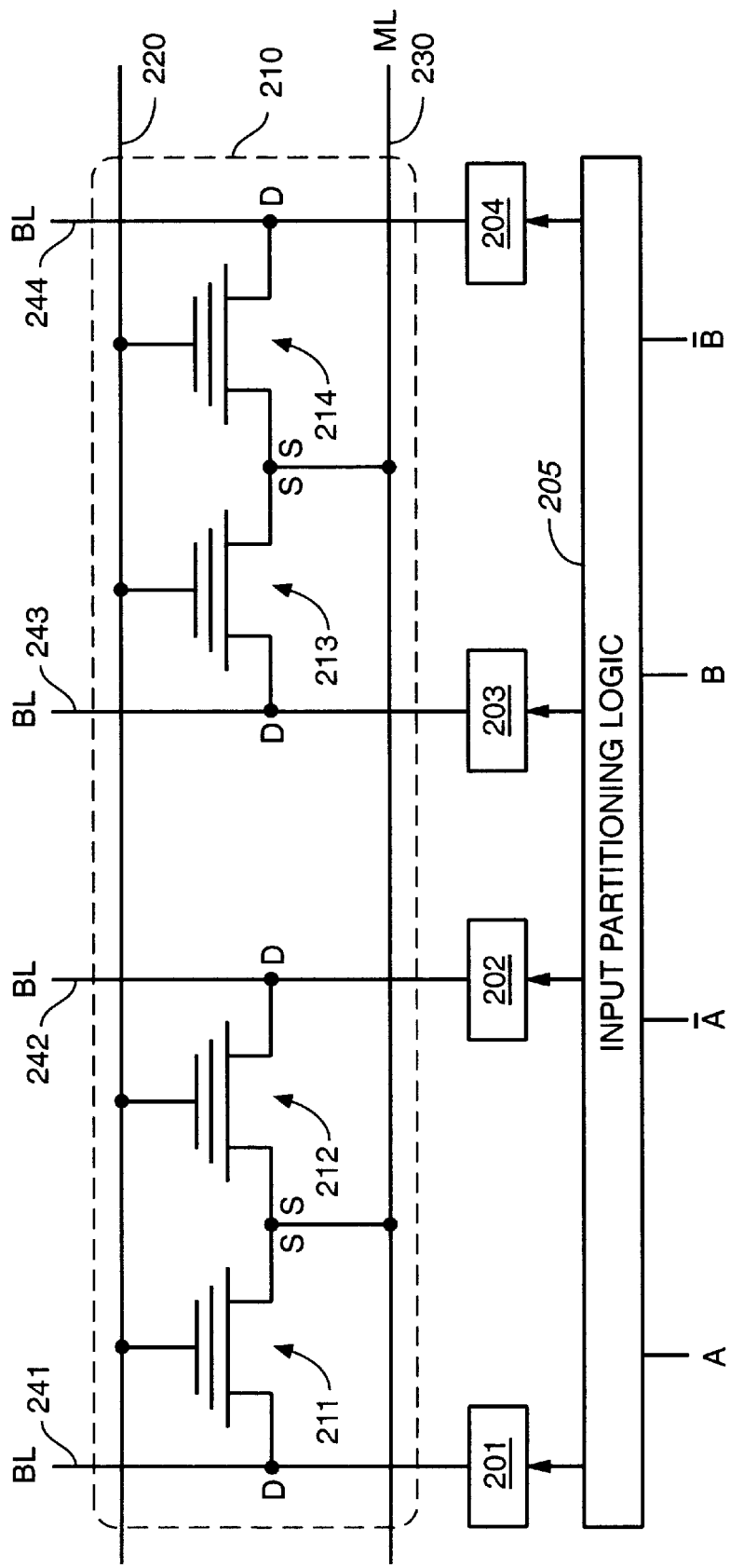
FIG._2

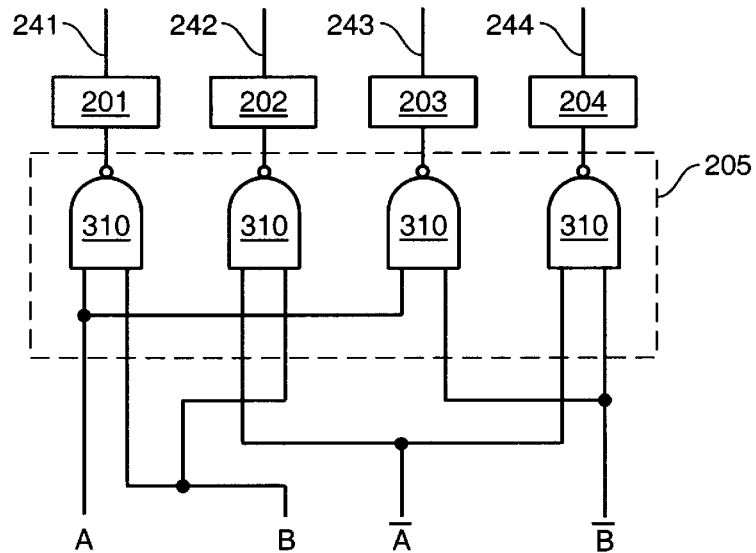
FIG._3A
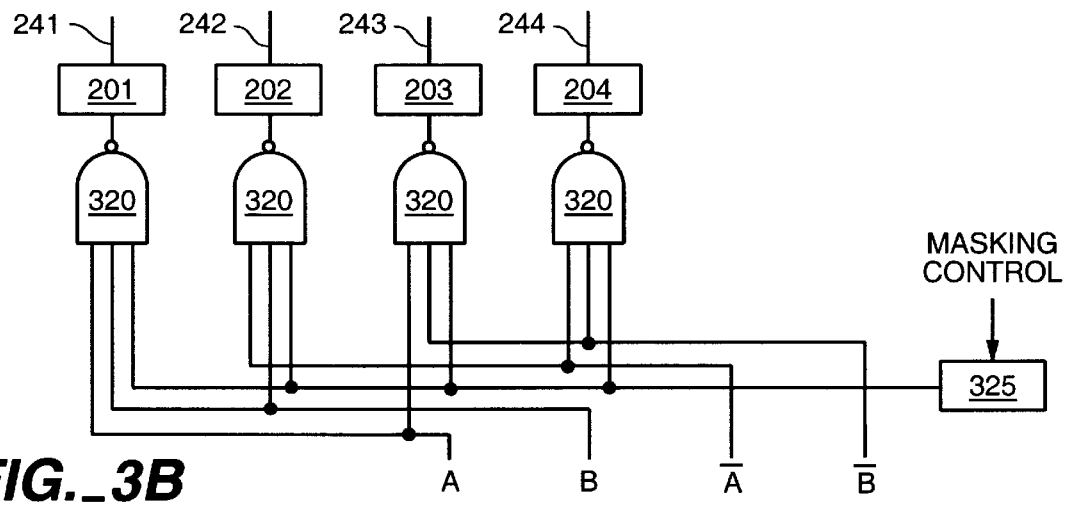
FIG._3B
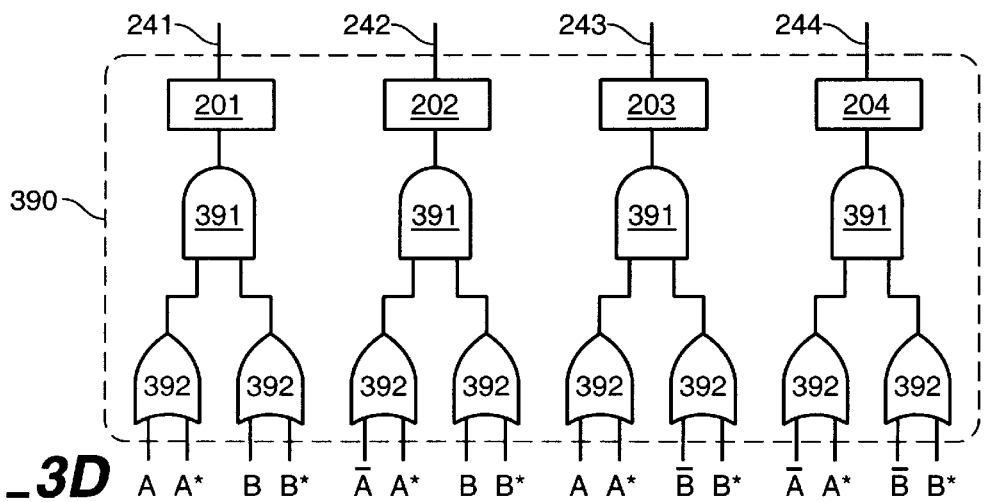
FIG._3D

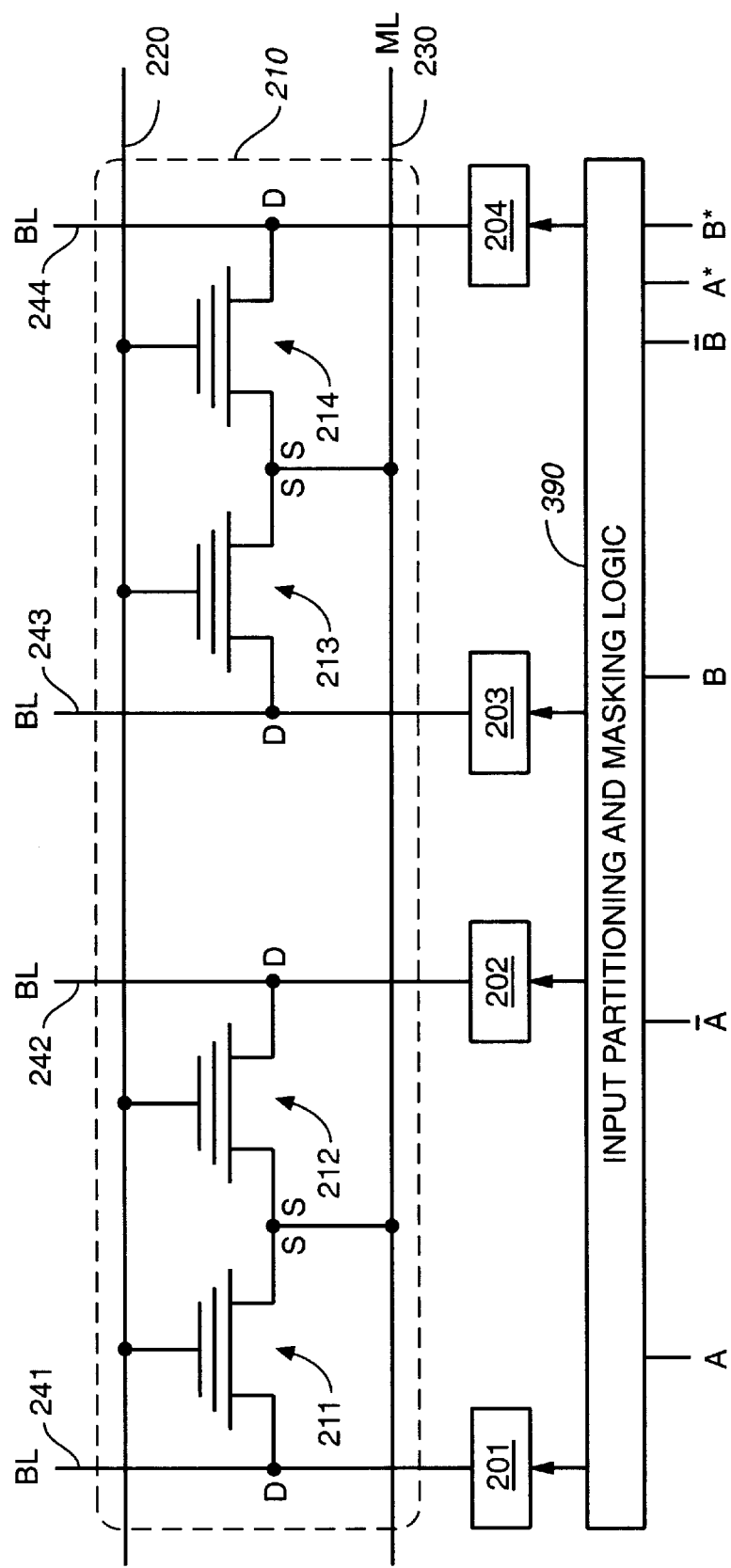
FIG._3C

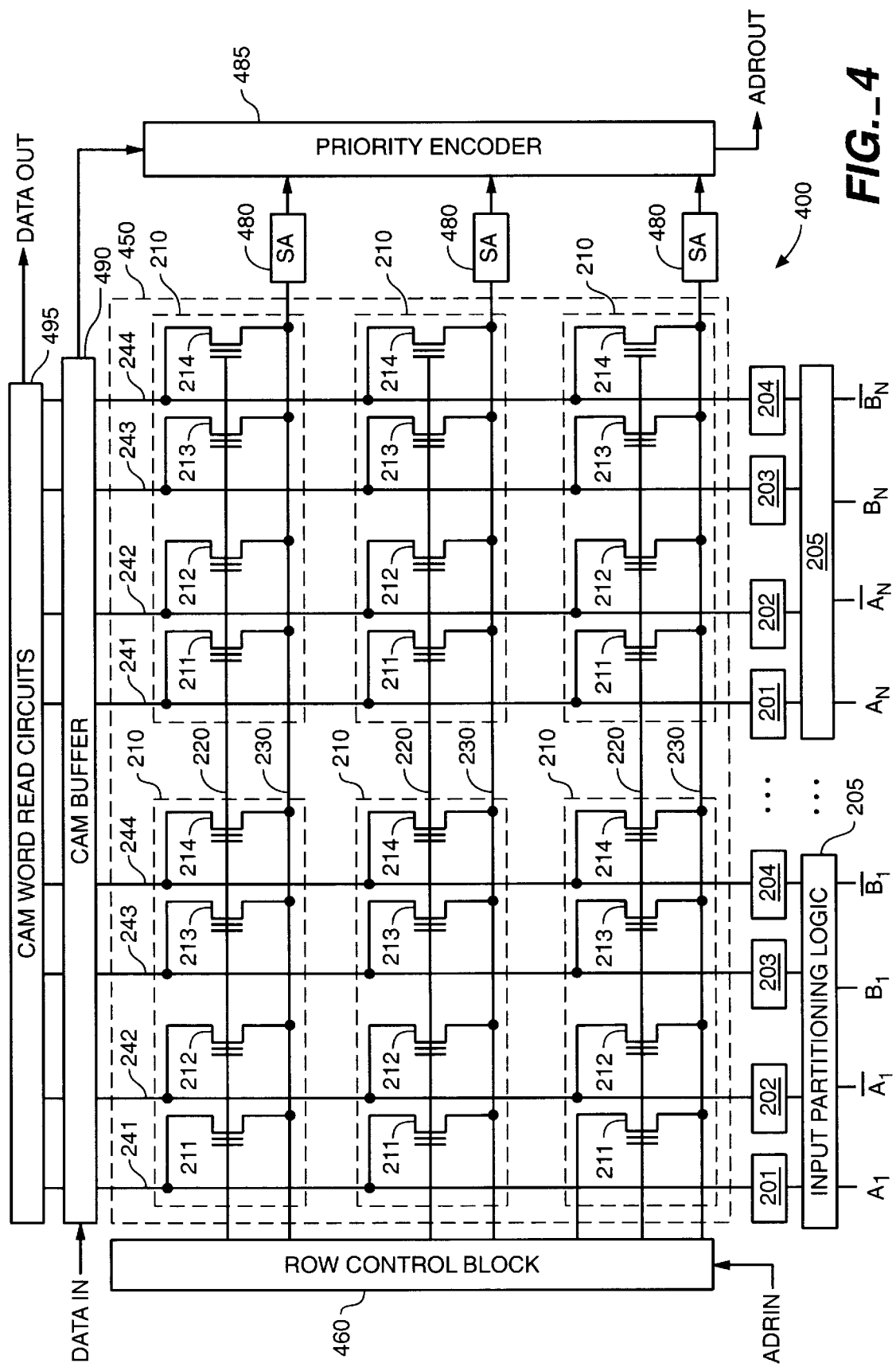
FIG._4

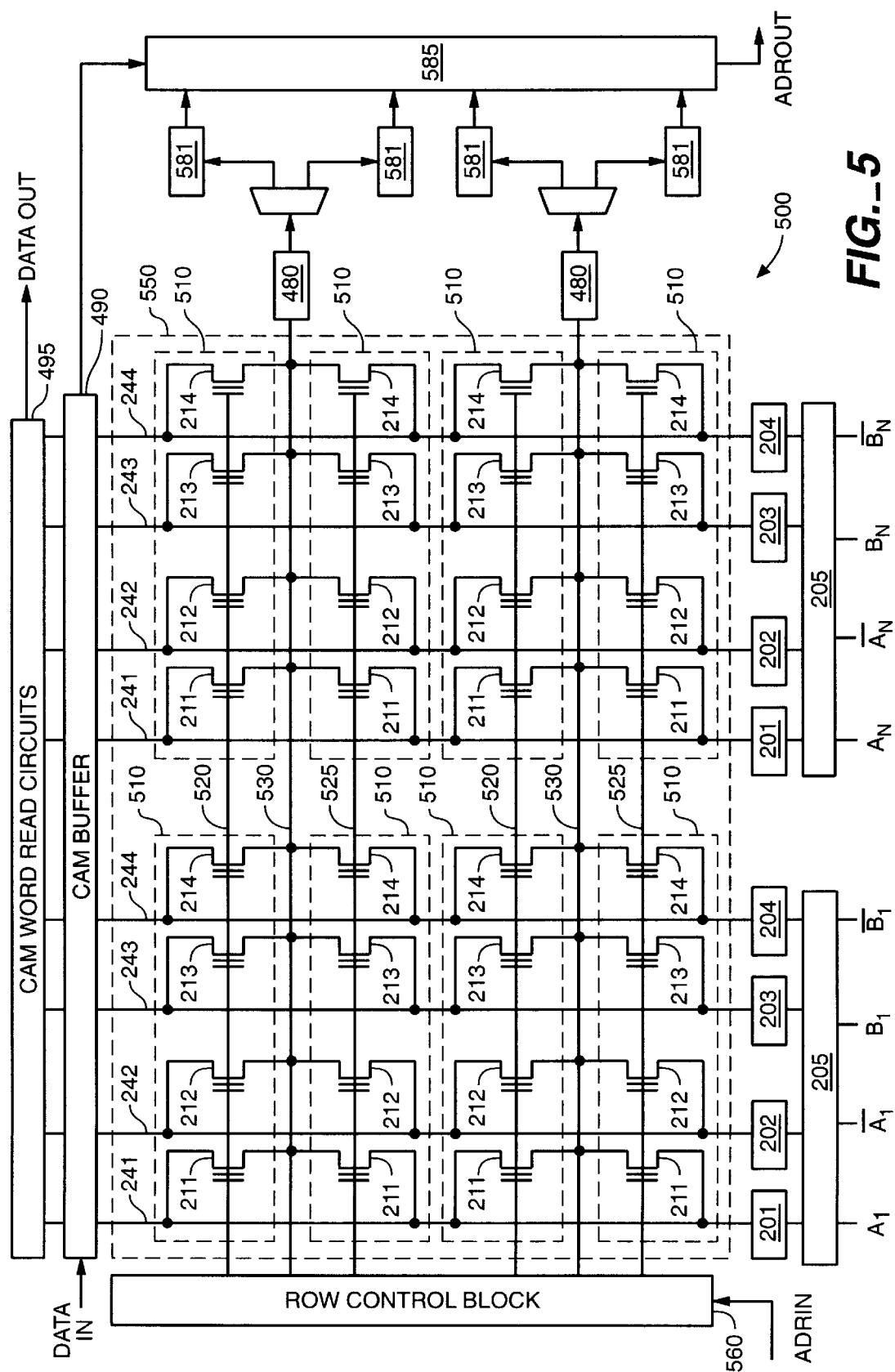
FIG._5

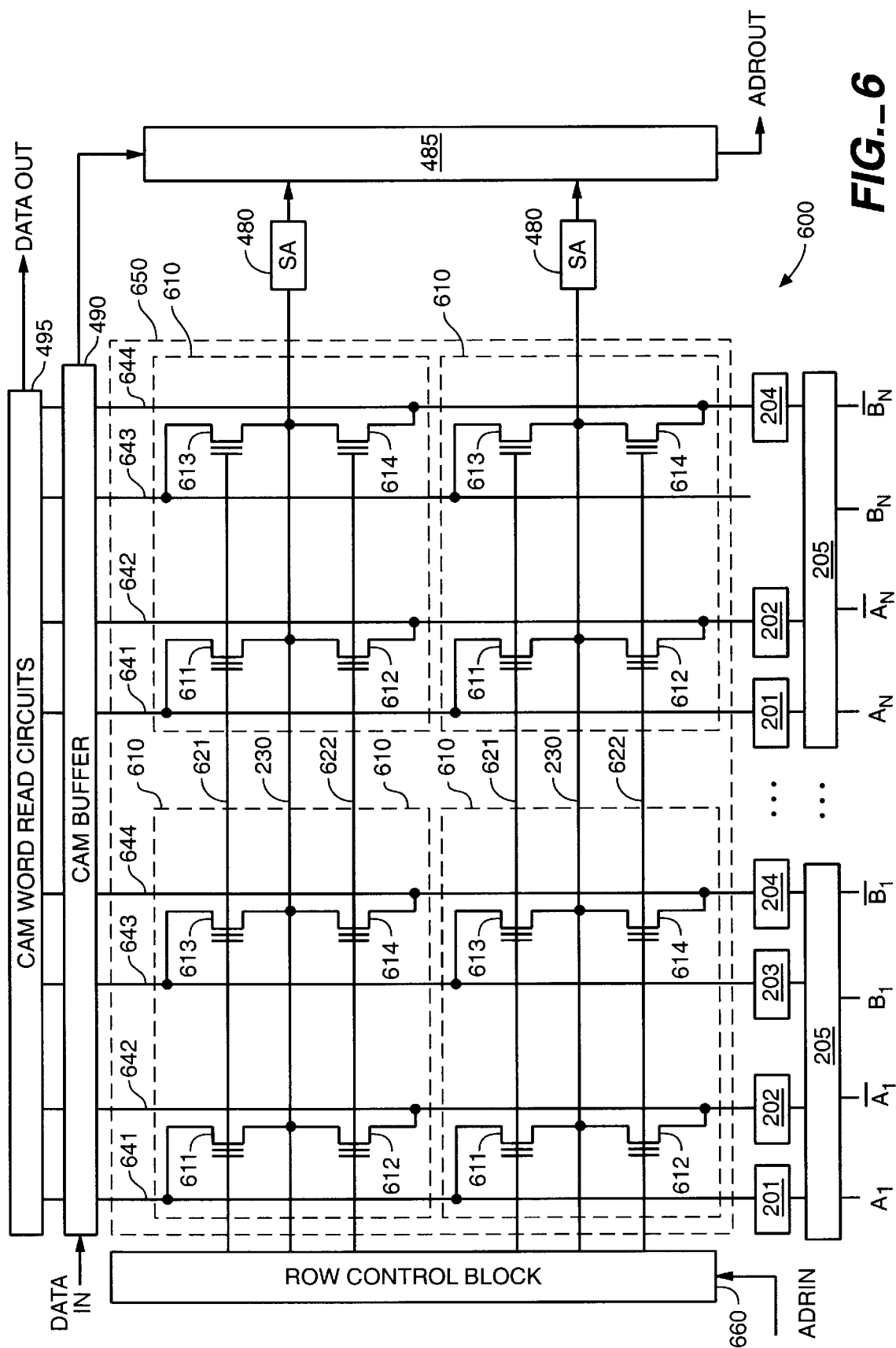
FIG._6

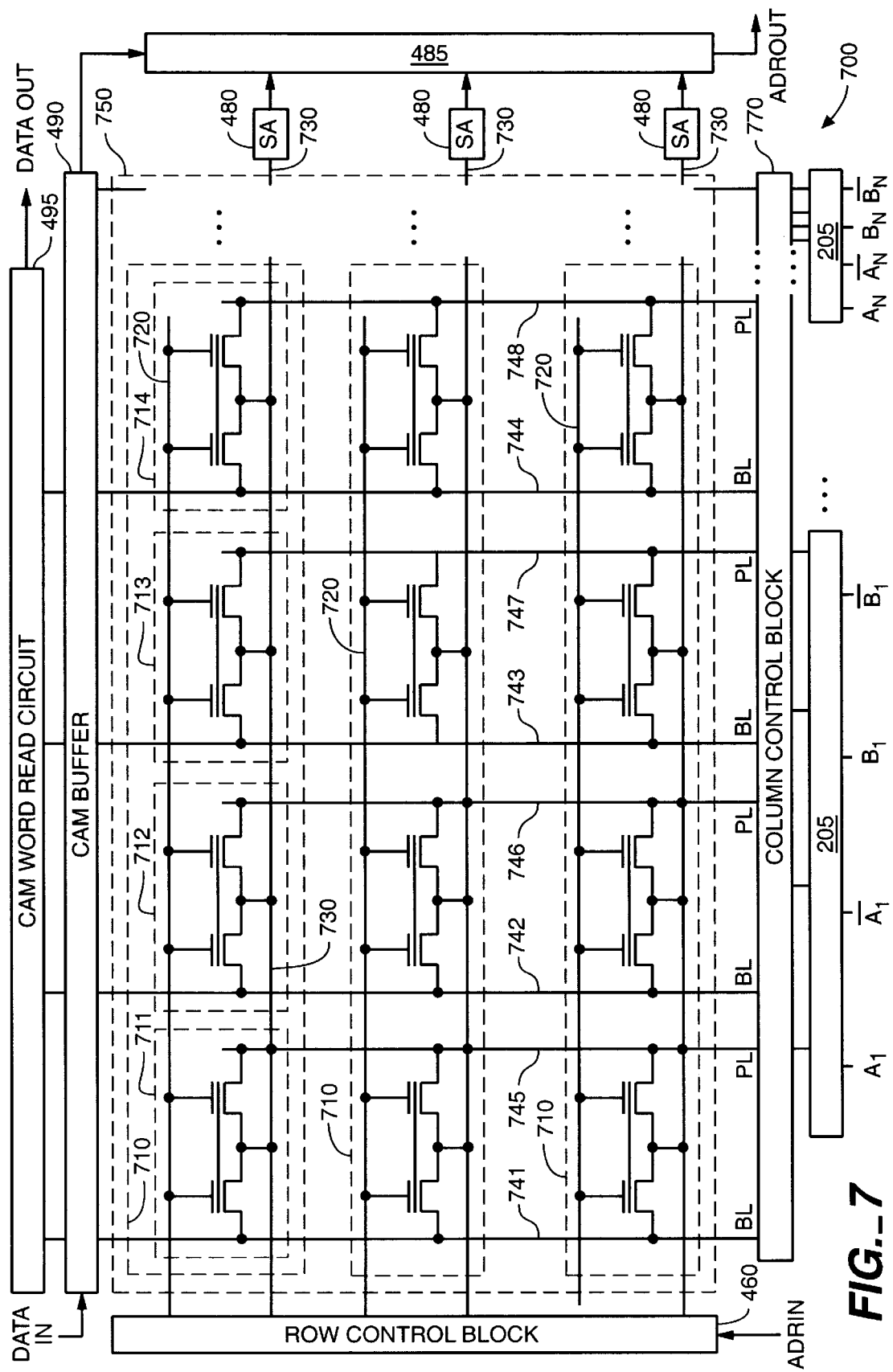
FIG._7

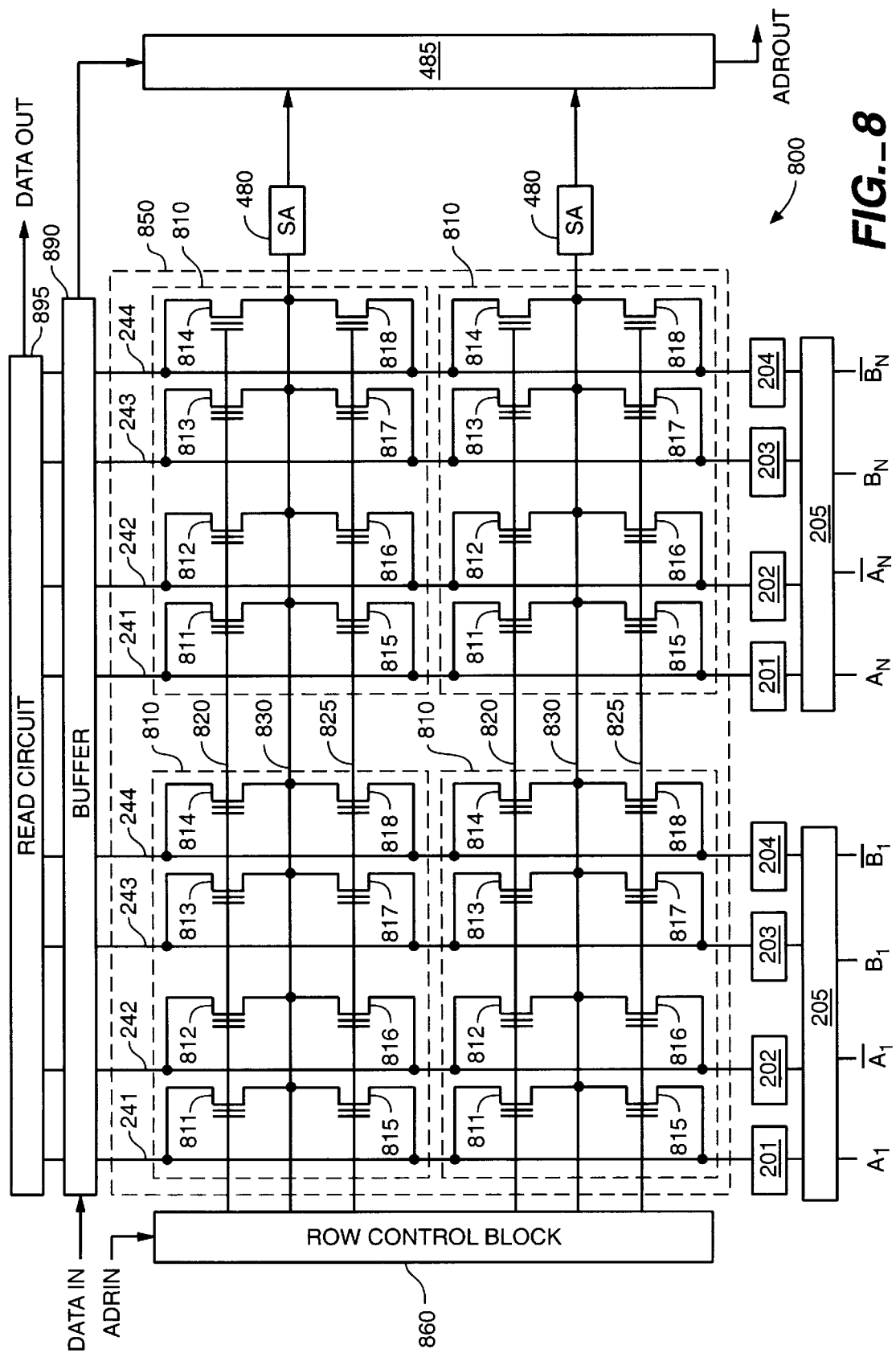
FIG._8

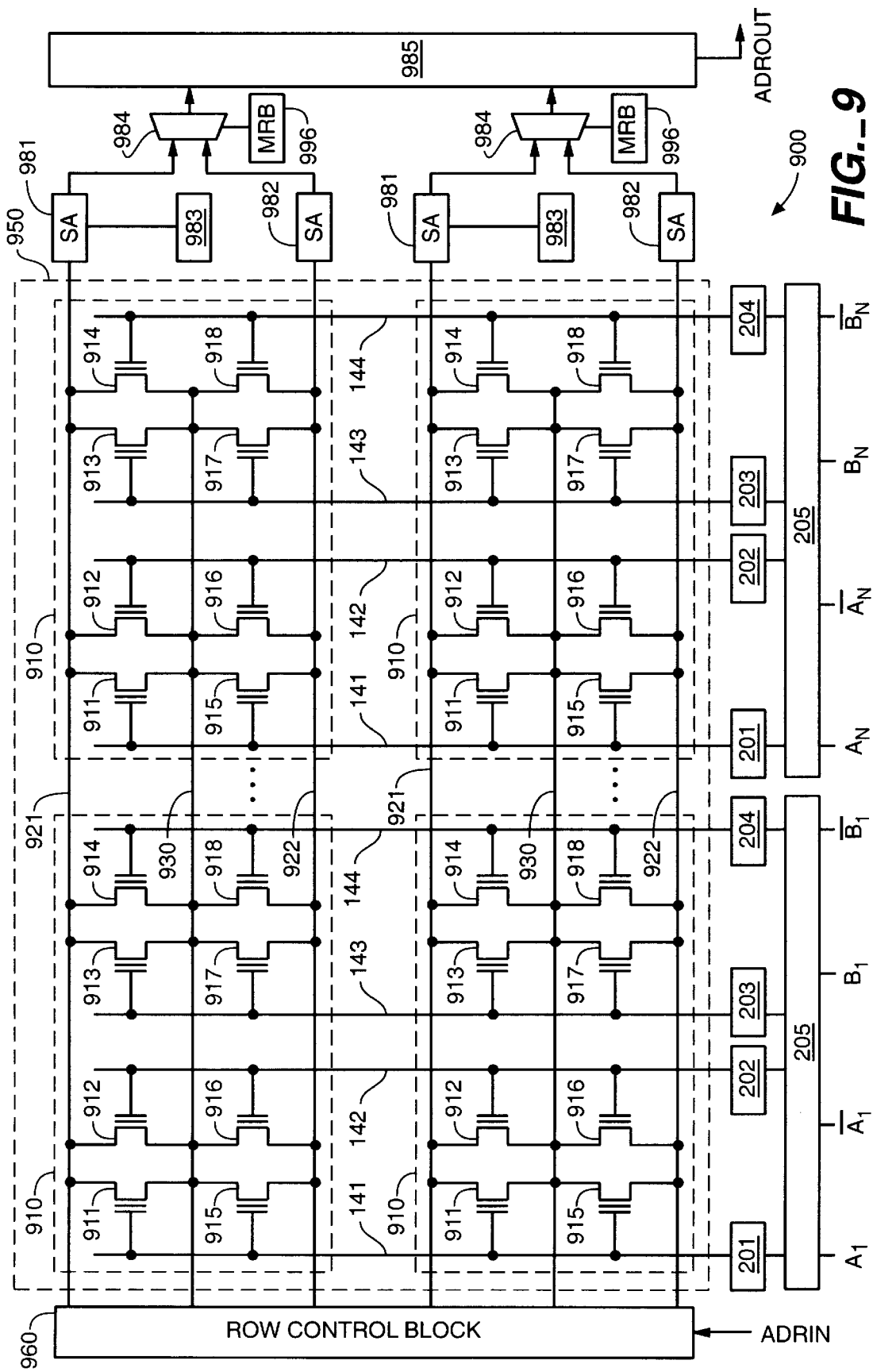
FIG._9

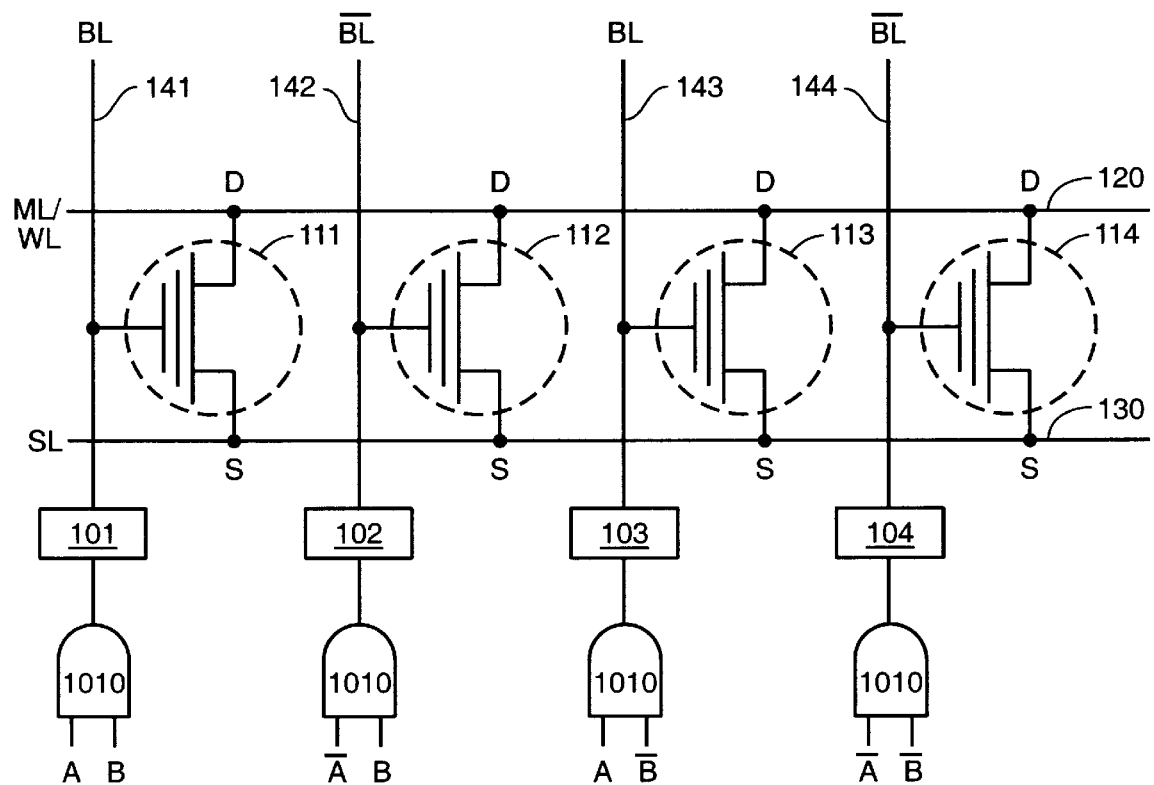
FIG._10
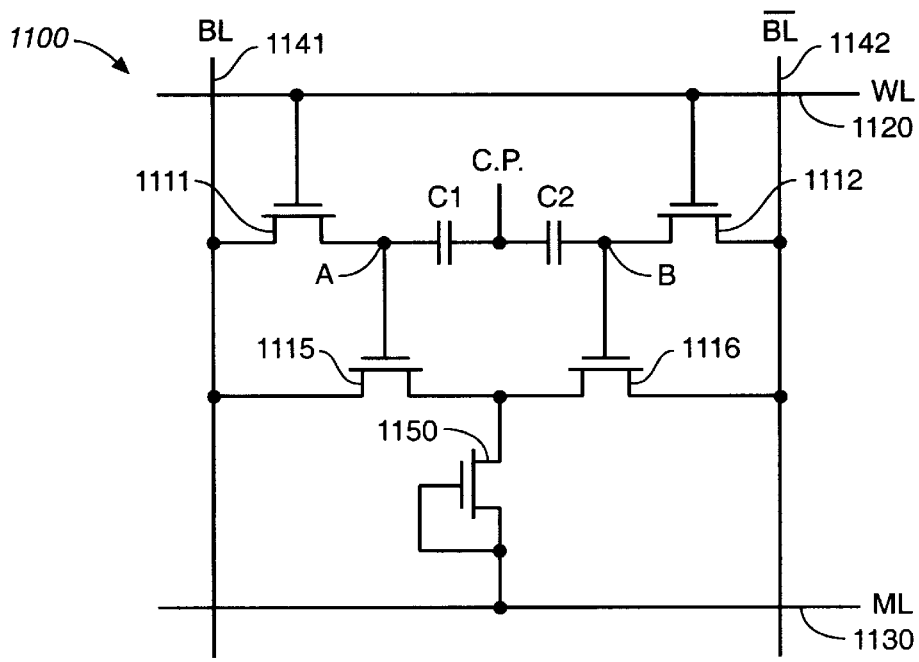
FIG._11

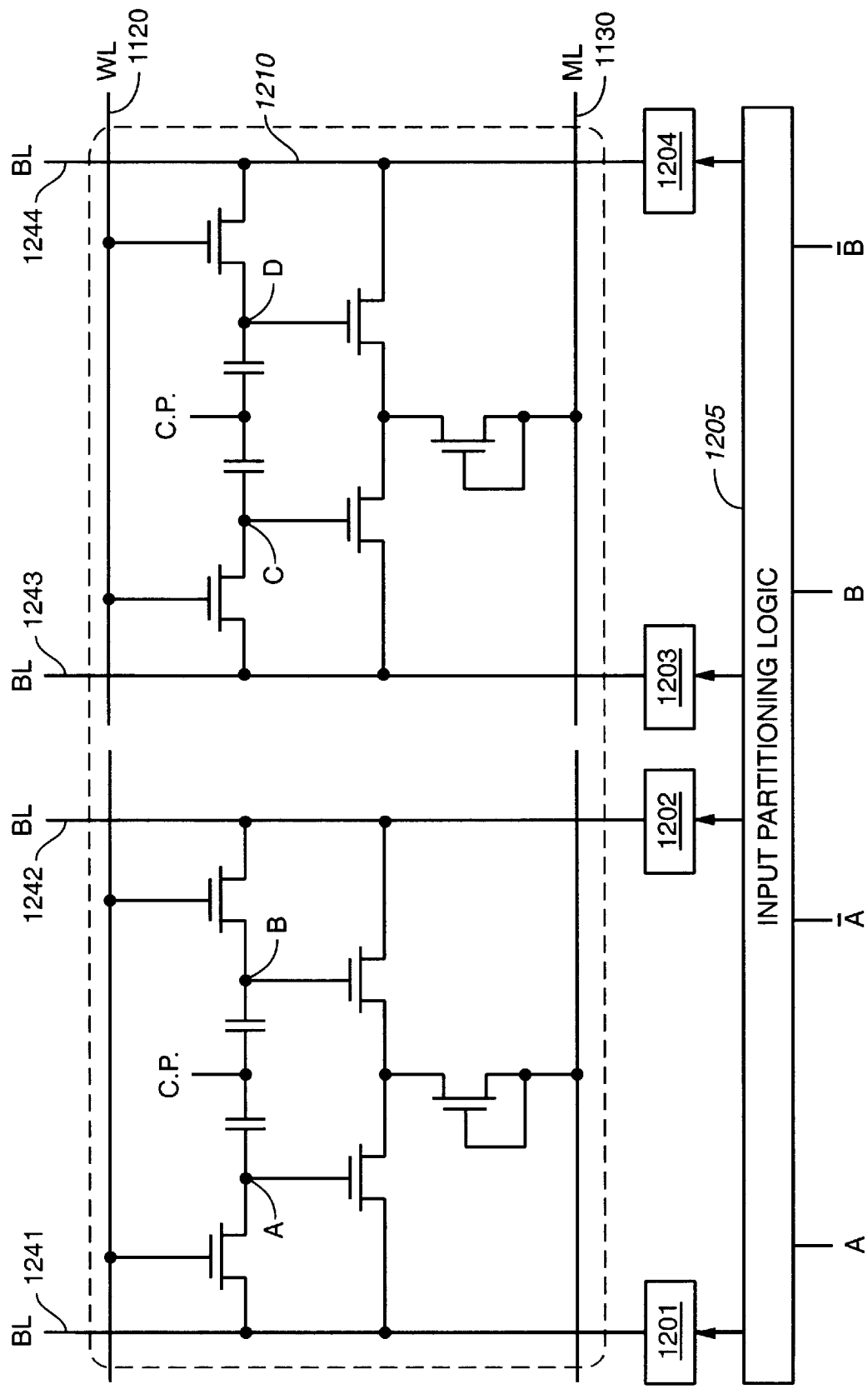
FIG._12

DATA ENCODING FOR CONTENT ADDRESSABLE MEMORIES

BACKGROUND

1. Field of the Invention

This invention relates to content addressable memories.

2. Description of Related Art

A content addressable memory (CAM) can store a large amount of data for simultaneous comparisons with input values. The conventional CAM includes an array of CAM cells where each row of the CAM array corresponds to a stored word. The CAM cells in a row couple to a word-line and a match-line associated with the row. A word-line connects to a control circuit that can select the row for a write operation or bias the word-line for a search. The match-line carries a signal that during a search, indicates whether the word stored in the row matches an input value. Each column of the conventional CAM array corresponds to the same bit position in all of the CAM words, and the CAM cells in a column couple to a pair of bit-lines associated with the column. A search applies to each pair of bit-lines, a pair of complementary binary signals that represent a bit of an input value. Each CAM cell changes the voltage on the associated match-line if the CAM cell stores a bit that does not match the bit represented on the attached bit-lines. Accordingly, if the voltage on a match-line remains unchanged during a search, the word stored in that row of CAM cells is equal to the input value.

Known CAM cells are based on SRAM, DRAM, or non-volatile memory circuits. SRAM-based and DRAM-based CAM cells are relatively fast but must be initialized by writing a complete set of data words to the CAM when the CAM is powered up or after a power failure. Non-volatile CAM avoids the overhead and delay required for initialization of the volatile CAM since the data values remain stored in non-volatile CAM cells even when power is turned off. Further, a non-volatile CAM requires fewer transistors and less silicon area than does an SRAM-based CAM. FIG. 1A shows a conventional two transistor (2-T) non-volatile CAM cell 100 which includes two floating-gate transistors 111 and 112 coupled to a word/match-line 120, a source-line 130, and a pair of bit-lines 141 and 142. Word/match-line 120, which couples to the drains of transistors 111 and 112, acts as both the word-line and the match-line for CAM cell 100. Source-line 130 grounds the sources of transistors 111 and 112, and bit-lines 141 and 142 couple to respective control gates of transistors 111 and 112 for applying respective input signals A and $\overline{\text{A}}$.

CAM cell 100 can store a single bit of data and compare the stored bit to an input bit that signals on bit-lines 141 and 142 represent. Before writing a bit in non-volatile CAM cell 100, floating-gate transistors 111 and 112 are electrically erased. One erase operation applies a high voltage (e.g., approximately 12 volts) to source-line 130 (i.e., to the sources of transistors in a row of CAM cells) and grounds bit-lines 141 and 142 (the control gates), with ML/WL 120 (the drains) floating. This process causes Fowler-Nordheim tunneling that removes electrons from the floating gates of transistors 111 and 112 and lowers the threshold voltages of transistors 111 and 112. Another erase operation, the negative-gate erase scheme, applies a negative voltage (e.g., −10 to −12 volts) to bit-lines 141 and 142 and a positive voltage (e.g., 5 to 6 volts) to source-line 130 of CAM cell 100. The erase operation places transistors 111 and 112 in a low threshold voltage state, for example, where the threshold voltage is less than the supply voltage Vcc for the CAM. For example, a floating-gate transistor in the low threshold voltage state may have a threshold voltage Vt less than about 3 volts when supply voltage Vcc is 5 volts, less than about 1 volt when supply voltage Vcc is 3 volts, or less than about 0.5 volts when supply voltage Vcc is 1.8 volts.

Floating-gate transistors 111 and 112 are individually programmable. Programming raises the threshold voltage of a floating-gate transistor to a level higher than supply voltage Vcc. For example, a floating-gate transistor in the high threshold voltage state may have a threshold voltage Vt of greater than 6 volts in a CAM where a supply voltage Vcc is 5 volts, more than 4 volts if supply voltage Vcc is 3 volts, or more than 2.8 volts if supply voltage Vcc is 1.8 volts. In accordance with one CAM storage convention, programming transistor 111 to the high threshold voltage state while transistor 112 remains in the low (or erased) threshold voltage state stores a 1 in CAM cell 100, and programming transistor 112 to the high threshold voltage state while transistor 111 remains in the low threshold voltage state, writes a 0 in CAM cell 100. A program process for a selected floating-gate transistor 111 or 112 in the CAM array raises the bit-line 141 or 142 coupled to the respective selected floating-gate transistor 111 or 112 to a high programming voltage Vpp (e.g., about 8 to 12 volts) and raises the word-line 120 coupled to the selected CAM cell to programming voltage Vw (e.g., 5 to 6 volts). Other unselected bit-lines and word-lines in the CAM array remain grounded or float. Source-line 130 is grounded. The combination of these voltages on the selected floating-gate transistor 111 or 112 causes channel hot electron injection that programs the selected transistor and raises their threshold voltages higher than Vcc.

A search biases match-lines 120 with a low-current, voltage source and applies complementary binary signals to bit-lines 141 and 142 to represent the bits of an input value. For the example storage convention described above, if a bit has value 1, an associated bit-line 141 is at supply voltage Vcc, and an associated bit-line 142 is grounded. If CAM cell 100 stores 1, transistor 111 has a high threshold voltage, and voltage Vcc on the control gate of transistor 111 does not turn on transistor 111 Similarly, grounding bit-line 142 fails to turn on transistor 112 even when transistor 112 is in the low threshold voltage state. Since neither transistor 111 nor 112 conducts, CAM cell 100 does not discharge or pull down the voltage on the match-line. If CAM cell 100 stores 0, transistor 111 has the low threshold voltage, and voltage Vcc on the control gate of transistor 111 causes transistor 111 to conduct and discharge or pull down the voltage on match-line 120. A sense amplifier connected to match-line 120 senses whether any CAM cells on match-line 120 conduct and thereby determines whether the input value matches the stored CAM word.

Conventional configurations of CAM arrays are formed from a number of non-volatile CAM cells. FIG. 1B shows a CAM cell 150 comprising of two 2-T CAM cells 100 of FIG. 1A. Two additional floating-gate transistors 113 and 114 have their drains coupled to word/match-line 120 and their sources coupled to source-line 130. The control gates of transistors 113 and 114 are coupled to respective bit-lines 143 and 144 for applying respective signals B and $\overline{\text{B}}$. Thus, a two 2-T CAM cell can be programmed to store bits representing a pair of data bits and be searched using various combinations of input bit pairs.

Table 1 indicates the possible combinations of stored data and input bits (AB) and parameters of two 2-T CAM cell 150 during a search.

TABLE 1

| Stored Data Pair/ Input Data Pair | Vt for 111 | Vt for 112 | Vt for 113 | Vt for 114 | BL 141 Volt | BL 142 Volt | BL 143 Volt | BL 144 Volt | ML 120 | Match ! |
|---|---|---|---|---|---|---|---|---|---|---|
| 00/00 | Low  | High | Low  | High | 0   | Vcc | 0   | Vcc | High | Yes |
| 00/01 | Low  | High | Low  | High | 0   | Vcc | Vcc | 0   | Low  | No  |
| 00/10 | Low  | High | Low  | High | Vcc | 0   | 0   | Vcc | Low  | No  |
| 00/11 | Low  | High | Low  | High | Vcc | 0   | Vcc | 0   | Low  | No  |
| 01/00 | Low  | High | High | Low  | 0   | Vcc | 0   | Vcc | Low  | No  |
| 01/01 | Low  | High | High | Low  | 0   | Vcc | Vcc | 0   | High | Yes |
| 01/10 | Low  | High | High | Low  | Vcc | 0   | 0   | Vcc | Low  | No  |
| 01/11 | Low  | High | High | Low  | Vcc | 0   | Vcc | 0   | Low  | No  |
| 10/00 | High | Low  | Low  | High | 0   | Vcc | 0   | Vcc | Low  | No  |
| 10/01 | High | Low  | Low  | High | 0   | Vcc | Vcc | 0   | Low  | No  |
| 10/10 | High | Low  | Low  | High | Vcc | 0   | 0   | Vcc | High | Yes |
| 10/11 | High | Low  | Low  | High | Vcc | 0   | Vcc | 0   | Low  | No  |
| 11/00 | High | Low  | High | Low  | 0   | Vcc | 0   | Vcc | Low  | No  |
| 11/01 | High | Low  | High | Low  | 0   | Vcc | Vcc | 0   | Low  | No  |
| 11/10 | High | Low  | High | Low  | Vcc | 0   | 0   | Vcc | Low  | No  |
| 11/11 | High | Low  | High | Low  | Vcc | 0   | Vcc | 0   | High | Yes |
| XX/00 | High | High | High | High | Vcc | Vcc | Vcc | 0   | High | Yes |
| XX/01 | High | High | High | High | Vcc | 0   | Vcc | Vcc | High | Yes |
| XX/10 | High | High | High | High | Vcc | Vcc | 0   | Vcc | High | Yes |
| XX/11 | High | High | High | High | 0   | Vcc | Vcc | Vcc | High | Yes |

A match for a CAM word occurs when all of the CAM cells in the row corresponding to the word find a match so that none of the CAM cells discharges or pulls down the match-line.

Programming all four transistors 111–114 in CAM cell 100 to the high threshold voltage state places the CAM cell in a "don't care" state designated herein by a stored value "X". In the don't-care state, CAM cell 100 indicates a match regardless of the input bit for a search because transistors in the high threshold voltage state do not conduct regardless of the input to the control gates, i.e., bit-lines 141–144. Consequently, transistors in the "don't care" state do not discharge or pull down the match-line.

As seen from Table 1, searching the data stored in a two 2-T CAM cell requires up to four transitions from Vcc to ground or ground to Vcc on bit-lines 141–144. For example, a search input of 01 applies 0 volt or ground to bit-lines 141 and 144 and applies supply voltage Vcc to bit-lines 142 and 143. If the next search input is 10, bit-lines 142 and 143 switch to low (0 volt or ground) and bit-lines 141 and 144 switch to high (i.e., Vcc). Search patterns between 00 and 11 also result in all four bit-lines 141–144 transitioning to a different voltage level. Because CAM arrays can be very large, e.g., having many thousands of word-lines and long bit-lines, with search cycles, occurring, for example, every 10–20 nsec, can consume large amounts of A.C. power due to the frequent toggling of the bit-lines during the search to compare input data and stored data. For example, for a 16 Megabit Flash CAM array (divided into 32 banks of 256 bits wide by 2048 words deep), each bit-line 141 or 142 has 2048 floating-gate transistors and each ML/WL 120 has 512 floating-gate transistors (i.e., 256-bit CAM words), where one half of the 512 bit-lines toggle from low to high during a search. Further, if operating at a 100 MHz clock rate, with a supply voltage Vcc of 1.8 volts and each bit-line having an estimated capacitive loading of approximately 2 pF, the A.C. current requirement during a search operation is approximately 3 Amps (i.e., $32*[(256*2 \text{ pF})*1.8 \text{ volts}*100*10^6 \text{ Hz}] \approx 3$ Amps). This bit-line switching current is a key factor in the overall power consumption of the CAM device. Accordingly, it is desirable to operate CAM arrays to reduce power consumption requirements.

SUMMARY

In accordance with an aspect of the invention, input partitioning logic is coupled to bit-lines of a content addressable memory (CAM) array having four-transistor (4-T) CAM cells. Each 4-T CAM cell includes non-volatile Flash memory cells or volatile DRAM cells with each cell having one terminal coupled to a word-line, one terminal coupled to a single line (e.g., a source-line or match-line), and one terminal coupled to one of four respective bit-lines. Prior to a program or search operation on the 4-T CAM cells, two input data bits and their complements are applied to the input partitioning logic, which can be two-input NAND, NOR, AND, or OR gates. By selecting the appropriate values for the input bits, individual ones of the memory cells in the 4-T CAM cell can be written or a desired two-bit pattern can be searched.

According to one storage convention, for a 4-T non-volatile flash CAM cell, each of four stored bit-pairs 00, 01, 10, and 11 in the 4-T CAM cell is represented by programming one of the four transistors in the 4-T CAM cell to a high threshold voltage state, while the remaining three transistors remain in the erased or low threshold voltage state. Thus, only one transistor, instead of two (using conventional methods, such as discussed above), is programmed to store a bit-pair, thereby reducing the programming current requirements and effectively increasing CAM cell endurance. Further, with input partitioning logic, a search only causes transitions from Vcc to ground or ground to Vcc in only two of the four bit-lines, instead of up to four transitions, as with the previously discussed method. Accordingly, the use of input partitioning logic prior to applying the search and program voltages to the bit-lines of the CAM cell results in less voltage transitions during searches and less required programming current. Consequently, power consumption while operating the CAM array is reduced.

Global masking techniques can be effectively applied to the input partitioning logic.

The present invention will be more fully understood upon consideration of the detailed description below, taken together with the accompanying drawings.

BRIEF DESCRIPTION OF THE DRAWINGS

FIG. 1A shows a known two-transistor (2-T) non-volatile CAM cell;

FIG. 1B shows a known two 2-T non-volatile CAM cell;

FIG. 2 shows a 4-T non-volatile CAM cell with input partitioning logic in accordance with an embodiment of the invention;

FIG. 3A shows a NAND partitioning logic in accordance with an embodiment of the invention;

FIG. 3B shows a NAND partitioning logic with per-bit-pair global masking in accordance with an embodiment of the invention;

FIG. 3C shows a partitioning and masking logic with bit-by-bit global masking in accordance with an embodiment of the invention;

FIG. 3D shows an AND partitioning and masking logic for use with the present invention;

FIG. 4 shows partitioning logic with a non-volatile CAM using the 4-T CAM cells of FIG. 2;

FIG. 5 shows partitioning logic with a non-volatile CAM in which two rows of non-volatile CAM cells share a match-line in accordance with an embodiment of the invention;

FIG. 6 shows partitioning logic with a non-volatile CAM in which non-volatile CAM cells have a split word lines in accordance with an embodiment of the invention;

FIG. 7 shows partitioning logic with a non-volatile CAM including an array of shared-floating-gate CAM cells in accordance with an embodiment of the invention;

FIGS. 8 and 9 show partitioning logic with non-volatile CAM arrays including eight-transistor dual CAM cells in accordance with alternative embodiments of the invention;

FIG. 10 shows an AND input partitioning logic used in conjunction with the CAM cell of FIG. 1B in accordance with one embodiment;

FIG. 11 shows a DRAM CAM cell in accordance with one embodiment for use with the present invention; and FIG. 12 a DRAM CAM cell formed with two DRAM CAM cells of FIG. 11 and input partitioning logic in accordance with one embodiment of the present invention.

Use of the same or similar reference symbols in different figures indicates similar or identical items.

DETAILED DESCRIPTION OF THE PREFERRED EMBODIMENTS

FIG. 2 shows a 4-T non-volatile Flash CAM cell 210 with tri-state bit-line drivers 201–204 and input partitioning logic 205 in accordance with an embodiment of the invention. CAM cell 210 is formed from a pair of two-transistor (2-T) Flash CAM cells, such as described in commonly-owned U.S. pat. appl. Ser. No. 09/293,134, entitled "Non-Volatile Content Addressable Memory", filed Apr. 16, 1999, bearing attorney Docket No. M-7323 US, which is incorporated by reference in its entirety. 4-T CAM cell 210 includes four floating-gate transistors 211–214 coupled to a word-line 220, a match-line 230, and four respective bit-lines 241–244. Floating-gate transistors 211–214 are single-transistor Flash memory cells of the kind used in conventional Flash memory, but alternative embodiments of the invention can replace transistors 211–214 with any type of non-volatile memory cells having a control gate, a source terminal, and a drain terminal available for connection as shown in FIG. 2. In CAM cell 210, word-line 220 couples to the control gates of transistors 211–214. Match-line 230 couples to the sources of transistors 211–214, and bit-lines 241–244 couple to respective drains of transistors 211–214. CAM cell 210 can store a pair of data bits and compare the stored bits to a pair of input bits that signals on bit-lines 241–244 represent.

Input partitioning logic 205, according to one embodiment shown in FIG. 3A, includes four two-input NAND gates 310 coupled to bit-line drivers 201–204, which are coupled to bit-lines 241–244. Each of four distinct pairs of input signals A and B and their complements are input to NAND gates 310. Depending on the value of signals A and B, a unique set of signals are applied to bit-line drivers (BLDs) 201–204, as shown in Table 2.

TABLE 2

| AB | signal to BLD 201 $(\overline{A*B})$ | signal to BLD 202 $(\overline{A*\overline{B}})$ | signal to BLD 203 $(\overline{\overline{A}*B})$ | signal to BLD 204 $(\overline{\overline{A}*\overline{B}})$ |
| --- | --- | --- | --- | --- |
| 00 | high | high | high | low |
| 01 | high | low | high | high |
| 10 | high | high | low | high |
| 11 | low | high | high | high |

As seen from Table 2, the input to one distinct bit-line driver is low for each of the four AB bit-pair combinations, thereby allowing transistors attached to a particular bit-line driver to be programmed or searched corresponding to one of the four bit-pair combinations. Thus, according to one convention, transistor 214 (attached to BLD 204) being programmed indicates 00 stored in CAM cell 210, transistor 212 (attached to BLD 202) being programmed indicates 01 stored in CAM cell 210, transistor 213 (attached to BLD 203) being programmed indicates 10 stored in CAM cell 210, and transistor 211 (attached to BLD 201) being programmed indicates 11 stored in CAM cell 210.

The write operation programs CAM cell 210 to store a pair of data bits, as mentioned above. For each CAM cell 210, floating-gate transistors 211–214 are individually programmable. The storage convention described above writes a 00 in CAM cell 210 by programming the threshold voltage of transistor 214 to a high threshold voltage state (Vt>Vcc) while transistors 211–213 remain in the low (or erased) threshold voltage state. Programming the threshold voltage of transistor 212 to the high threshold voltage state while transistors 211, 213, and 214 remain in the low threshold voltage state writes a 01 in CAM cell 210. Programming the threshold voltage of transistor 213 to the high threshold voltage state while transistors 211, 212, and 214 remain in the low threshold voltage state writes a 10 in CAM cell 210. Finally, 11 is stored in CAM cell 210 by programming the threshold voltage of transistor 211 to the high threshold voltage state while transistors 212–214 remain in the erased state. Thus, 4-T CAM cell 210 can be programmed to store one of four bit-pairs 00, 01, 10, and 11 by programming one of the four transistors 211–214 to a high threshold voltage state, while the remaining three transistors remain in a low threshold voltage state.

Global masking on bit-pairs (i.e., along the same two bit-lines for all words in an array) or a more "selective" masking in which bit-pairs along the same two bit-lines and also along selected word-lines can also be used with the present invention. FIG. 3B shows masking with the NAND partitioning logic of FIG. 3A. Depending on a masking control signal, a masking register 325 applies either a "high" signal (no masking) or a "low" signal (masking) to each of four 3-input NAND gates 320. Without masking, the high signal from register 325 does not affect the output of NAND gates 320, i.e., the output is only dependent on the logic states of inputs A and B. However, with masking, the low signal from register 325 forces the output of NAND gates 320 to be high, regardless of the state of inputs A and B. Consequently, with masking, transistors 211–214 of different words connected to the same bit-lines 241–244, which are each programmed to either a high or low threshold voltage state, can effectively represent a bit-pair designated by "XX" ("don't care" state for the bit-pair).

Masking where transistors 211–214 are programmed to the high threshold voltage state enables a search operation to indicate a "match" regardless of the search inputs A and B. This also allows a more selective masking in that all the transistors coupled to the associated bit-lines do not have to be masked, only those that have also been selected by word-lines 220 at the programming voltage. Note that if masking is only utilized during programming operations (i.e., register 325 applies a low signal only during programming), floating-gate transistors 211–214 can only be programmed each to the high threshold voltage state, as will be discussed below in conjunction with the search operations, which effectively programs the bit-pair of a selected word to a "don't care" state. In this case, "unmask" operation requires erasing all four floating-gate transistors 211–214 and then writing the required data back into them before a search.

For programming a selected floating-gate transistor 211–214 in CAM cell 210, a high voltage Vpp (e.g., about 8 to 12 volts) is applied to word-line 220, and 0 volt or ground is applied to match-line 230. An associated one of bit-line drivers 201–204 applies a programming voltage Vw (e.g., about 5 to 6 volts) to the bit-line 241–244 coupled to the selected floating-gate transistor 211–214. Bit-lines 241–244 that are coupled to unselected transistors remain grounded or float. The power supply for bit-line drivers 201–204 can switch between Vcc during a search operation to Vw during a program or write operation. The combination of these voltages on the selected floating-gate transistor 211–214 causes channel hot electron (CHE) injection that programs the selected transistor to the high threshold voltage state where the threshold voltage is higher than supply voltage Vcc.

Table 3 below lists programming voltages Vw applied by bit-line drivers 201–204 to respective bit-lines 241–244 for each bit-pair combination to program or write data values to an attached one of transistors 211–214 corresponding to the bit-pair combination. A "don't care" state, designated by AB=XX, is also included in Table 3.

TABLE 3

| AB | voltage on BL 241 | voltage on BL 242 | voltage on BL 243 | voltage on BL 244 |
|---|---|---|---|---|
| 00 | ground | ground | ground | Vw |
| 01 | ground | Vw | ground | ground |
| 10 | ground | ground | Vw | ground |
| 11 | Vw | ground | ground | ground |
| XX | Vw | Vw | Vw | Vw |

Prior to programming selected transistors, CAM cell 210 is erased by erasing floating-gate transistors 211–214. A negative-gate erase operation for CAM cell 210 applies a negative voltage (e.g., −8 to −10 volts) to word-line 220 (i.e., to the control gates) and applies a positive voltage (e.g., 5 to 7 volts) to match-line 230 (i.e., to the sources). The erase operation can employ alternative erases methods such as a grounded-gate erase or channel erase. Commonly-owned U.S. pat. appl. Ser. No. UNKNOWN, entitled "Non-Volatile Memories with Improved Endurance and Extended Lifetime", filed Apr. 16, 1999, bearing attorney Docket No. M-7357 US, describes suitable erase methods which can further improve Flash memory cell endurance and is hereby incorporated by reference in its entirety. The combination of the control gate and source voltages causes Fowler-Nordheim (FN) tunneling in transistors 211–214. The FN tunneling removes electrons from the floating gates and lowers threshold voltages of transistors 211–214. The erase operation places transistors 211–214 in a low threshold voltage state, for example, where the threshold voltage Vt is less than about 1 volt when supply voltage Vcc is about 3 volts, or less than about 0.5 volts when supply voltage Vcc is about 1.8 volts.

For a search, word-line 220 and match-line 230 are charged to near supply voltage Vcc, and complementary binary signals A and $\overline{A}$ and B and $\overline{B}$ are applied in various logic combinations to bit-lines 241–244. The convention for representing a bit-pair on bit-lines 241–244 during a search is opposite to the convention described above for storing bit-pairs in CAM cell 210. For example, if transistor 212 is in the high threshold voltage state and transistors 211, 213, and 214 are in the low threshold voltage or erased state to store a 01, ground or 0 volt is applied to bit-line 242 attached to transistor 212, and supply voltage Vcc is applied to bit-lines 241, 243, and 244 attached to respective transistors 211, 213, and 214 to represent a search for bit-pair 01. Different conventions could be used for both the data storage and the search signals. Because word-line 220 during a search is at supply voltage Vcc, none of the transistors 211–214 that are in the high threshold voltage state (which has a threshold voltage higher than Vcc) conduct. Transistors 211–214 in the low threshold voltage state conduct only if the bit-line 241–244 attached to the corresponding transistor is at 0 volt or grounded.

Referring back to FIG. 3B, whereas programming transistors 211–214 allows "selective masking", as discussed above, global masking for each bit-pair is also possible during search operations. Global masking allows each of the four transistors 211–214 in CAM cell 210 to be either in the high or low threshold voltage state. When global masking is utilized during a search operation, register 325 applies a low signal to NAND gates 320, which causes bit-line drivers 201–204 to apply high signals to bit-lines 241–244. Therefore, none of transistors 211–214 conduct, regardless of whether input A or B is at a high or low state. Consequently, a match of all the CAM cells along the same bit-lines always results with global masking regardless of the programmed state of transistors 211–214. To unmask the CAM cell during a search, mask register 325 can later apply a "high" signal to each of the four three-input NAND gates 320 to unmask and resume the search for matches with input bit pairs. However, if selective masking is utilized during a programming operation and no masking is used during a search operation, floating-gate transistors 111–114 of a selected word are each programmed to the high threshold voltage state. This is the "don't care" state because no current can flow through floating-gate transistors 211–214 regardless of the logic state of bit-lines 241–244 during a search.

Table 4 indicates the possible combinations of stored and input search bits and some of the parameters of CAM cell 210 during a search.

TABLE 4

| Stored Data Pair/ Input Data Pair | Vt for 211 | Vt for 212 | Vt for 213 | Vt for 214 | BL 241 Volt | BL 242 Volt | BL 243 Volt | BL 244 Volt | ML 230 | Match ! |
|---|---|---|---|---|---|---|---|---|---|---|
| 00/00 | Low  | Low  | Low  | High | Vcc | Vcc | Vcc | 0   | High | Yes |
| 00/01 | Low  | Low  | Low  | High | Vcc | 0   | Vcc | Vcc | Low  | No  |
| 00/10 | Low  | Low  | Low  | High | Vcc | Vcc | 0   | Vcc | Low  | No  |
| 00/11 | Low  | Low  | Low  | High | 0   | Vcc | Vcc | Vcc | Low  | No  |
| 01/00 | Low  | High | Low  | Low  | Vcc | Vcc | Vcc | 0   | Low  | No  |
| 01/01 | Low  | High | Low  | Low  | Vcc | 0   | Vcc | Vcc | High | Yes |
| 01/10 | Low  | High | Low  | Low  | Vcc | Vcc | 0   | Vcc | Low  | No  |
| 01/11 | Low  | High | Low  | Low  | 0   | Vcc | Vcc | Vcc | Low  | No  |
| 10/00 | Low  | Low  | High | Low  | Vcc | Vcc | Vcc | 0   | Low  | No  |
| 10/01 | Low  | Low  | High | Low  | Vcc | 0   | Vcc | Vcc | Low  | No  |
| 10/10 | Low  | Low  | High | Low  | Vcc | Vcc | 0   | Vcc | High | Yes |
| 10/11 | Low  | Low  | High | Low  | 0   | Vcc | Vcc | Vcc | Low  | No  |
| 11/00 | High | Low  | Low  | Low  | Vcc | Vcc | Vcc | 0   | Low  | No  |
| 11/01 | High | Low  | Low  | Low  | Vcc | 0   | Vcc | Vcc | Low  | No  |
| 11/10 | High | Low  | Low  | Low  | Vcc | Vcc | 0   | Vcc | Low  | No  |
| 11/11 | High | Low  | Low  | Low  | 0   | Vcc | Vcc | Vcc | High | Yes |
| XX/00 | High | High | High | High | Vcc | Vcc | Vcc | 0   | High | Yes |
| XX/01 | High | High | High | High | Vcc | 0   | Vcc | Vcc | High | Yes |
| XX/10 | High | High | High | High | Vcc | Vcc | 0   | Vcc | High | Yes |
| XX/11 | High | High | High | High | 0   | Vcc | Vcc | Vcc | High | Yes |

A match for a CAM cell 210 occurs when none of the four transistors 211–214 conduct, thereby preventing discharge of the voltage on the match-line 230.

As seen from a comparison between Table 1 and Table 4, only one out of four transistors in 4-T CAM cell 210 is programmed using the NAND partitioning logic described above, as compared with two out of the four transistors using conventional methods, and searching the data stored in 4-T CAM cell 210 requires only two transitions from Vcc to ground or ground to Vcc, instead of up to four such transitions with conventional methods. Lower programming and switching requirements result in a CAM array using less AC power (up to 50% less). Furthermore, because only one (instead of two) out of four transistors in each 4-T CAM cell is programmed, less programming current is needed and CAM cell endurance effectively improves.

Although the above has been described with a NAND partitioning logic, other types of partitioning logic can also be used to achieve the benefits of the present invention. For example, Table 5 shows the signals applied to bit-line drivers 201–204 using an AND partitioning logic. The voltage levels for programming and search operations are the same as described above. However, with AND partitioning, three out of the four transistors in the CAM cell need to be programmed to a "high" state, while the remaining transistor remains in the "low" or erased state because the polarities of the search signals are opposite to those shown in Table 2 for NAND input partitioning.

TABLE 5

| AB | signal to BLD 201 $(A*B)$ | signal to BLD 202 $(\overline{A}*B)$ | signal to BLD 203 $(A*\overline{B})$ | signal to BLD 204 $(\overline{A}*\overline{B})$ |
|---|---|---|---|---|
| 00 | low  | low  | low  | high |
| 01 | low  | high | low  | low  |

TABLE 5-continued

| AB | signal to BLD 201 $(A*B)$ | signal to BLD 202 $(\overline{A}*B)$ | signal to BLD 203 $(A*\overline{B})$ | signal to BLD 204 $(\overline{A}*\overline{B})$ |
|---|---|---|---|---|
| 10 | low  | low  | high | low  |
| 11 | high | low  | low  | low  |

In other embodiments, partitioning logic using an OR function is shown in Table 6. In this situation, programming transistor 211 associated with BLD 201 to a high threshold voltage state while leaving transistors 212–214 in an erased or low threshold voltage state corresponds to a stored bit-pair 00. Similarly, the stored bit-pair 01 corresponds to only transistor 213 associated with BLD 203 being programmed to the high threshold voltage state, the stored bit-pair 10 corresponds to only transistor 212 associated with BLD 202 being programmed to the high threshold voltage state, and the stored bit-pair 11 corresponds to only transistor 214 associated with BLD 204 being programmed to the high threshold voltage state.

TABLE 6

| AB | signal to BLD 201 $(A + B)$ | signal to BLD 202 $(A + B)$ | signal to BLD 203 $(A + B)$ | signal to BLD 204 $(A + B)$ |
|---|---|---|---|---|
| 00 | low  | high | high | high |
| 01 | high | high | low  | high |
| 10 | high | low  | high | high |
| 11 | high | high | high | low  |

Table 7 shows the possible combinations of stored and input search bits and some of the parameters of CAM cell 210 during a search using OR partitioning logic.

TABLE 7

| Stored Pair/ Input Pair | Vt for 211 | Vt for 212 | Vt for 213 | Vt for 214 | BL 241 Volt | BL 242 Volt | BL 243 Volt | BL 244 Volt | ML 230 | Match ? |
|---|---|---|---|---|---|---|---|---|---|---|
| 00/00 | High | Low  | Low  | Low  | 0   | Vcc | Vcc | Vcc | High | Yes |
| 00/01 | High | Low  | Low  | Low  | Vcc | Vcc | 0   | Vcc | Low  | No  |
| 00/10 | High | Low  | Low  | Low  | Vcc | 0   | Vcc | Vcc | Low  | No  |
| 00/11 | High | Low  | Low  | Low  | Vcc | Vcc | Vcc | 0   | Low  | No  |
| 01/00 | Low  | Low  | High | Low  | 0   | Vcc | Vcc | Vcc | Low  | No  |
| 01/01 | Low  | Low  | High | Low  | Vcc | Vcc | 0   | Vcc | High | Yes |
| 01/10 | Low  | Low  | High | Low  | Vcc | 0   | Vcc | Vcc | Low  | No  |
| 01/11 | Low  | Low  | High | Low  | Vcc | Vcc | Vcc | 0   | Low  | No  |
| 10/00 | Low  | High | Low  | Low  | 0   | Vcc | Vcc | Vcc | Low  | No  |
| 10/01 | Low  | High | Low  | Low  | Vcc | Vcc | 0   | Vcc | Low  | No  |
| 10/10 | Low  | High | Low  | Low  | Vcc | 0   | Vcc | Vcc | High | Yes |
| 10/11 | Low  | High | Low  | Low  | Vcc | Vcc | Vcc | 0   | Low  | No  |
| 11/00 | Low  | Low  | Low  | High | 0   | Vcc | Vcc | Vcc | Low  | No  |
| 11/01 | Low  | Low  | Low  | High | Vcc | Vcc | 0   | Vcc | Low  | No  |
| 11/10 | Low  | Low  | Low  | High | Vcc | 0   | Vcc | Vcc | Low  | No  |
| 11/11 | Low  | Low  | Low  | High | Vcc | Vcc | Vcc | 0   | High | Yes |

As seen from Table 7, only one transistor is programmed for each of the four bit-pair combinations, and only two transitions from Vcc to ground or ground to Vcc occur on the bit-lines during searches, thereby providing the same advantages as with the NAND partitioning logic described above.

Table 8 shows the signals applied to bit-line drivers 201–204 using a NOR partitioning logic. The voltage levels for programming and search operations are the same as described above. Similar to the AND partitioning, however, three out of the four transistors in the CAM cell need to be programmed to a "high" state, while the remaining transistor remains in the "low" or erased state when using OR partitioning.

TABLE 8

| AB | signal to BLD 201 (A+B) | signal to BLD 202 ($\bar{A}$+B) | signal to BLD 203 (A+$\bar{B}$) | signal to BLD 204 ($\bar{A}$+$\bar{B}$) |
|---|---|---|---|---|
| 00 | high | low  | low  | low  |
| 01 | low  | low  | high | low  |
| 10 | low  | high | low  | low  |
| 11 | low  | low  | low  | high |

In addition to the various logical functions usable with input partitioning logic 205 and the per-bit pair global masking, bit-by-bit global masking can be incorporated into input partitioning logic 205 in other embodiments of the invention. FIG. 3C shows an input partitioning and masking logic 390 coupled to 4-T Flash CAM cell 210. Logic 390 is similar to logic 205, as described above, except that masking bits A* and B* are also input to logic 390 in addition to the input bits A and B and their complements. The masking bits A* and B* can be selected from a masking register (not shown) when a masking is desired.

FIG. 3D shows input partitioning and masking logic 390 using AND partitioning logic according to one embodiment. Logic 390 includes four two-input AND gates 391 having outputs coupled to drivers 201–204 and inputs coupled to two two-input OR gates 392. Each pair of OR gates 392 has one input each corresponding to an original pair of input bits A, $\bar{A}$, B, and $\bar{B}$. The other input of each of the pair of OR gates 392 is masking bit A* and masking bit B*. When masking bit A* is high, bits A and $\bar{A}$ are masked, and when masking bit B* is high, bits B and $\bar{B}$ are masked. By selecting masking bit A* or masking bit B* high during a write operation, transistors 211 and 212 can be programmed high for a "don't care" state or transistors 213 and 214 can be programmed high for a "don't care state". Thus, bit-by-bit global masking of the CAM cell is possible. If both masking bits A* and B* are high during a write operation, all four transistors 211–214 are programmed high, resulting in a "don't care" state for the bit-pair (i.e., per-bit-pair masking).

Input partitioning logic 205 can be applied to various CAM architectures, such as those described in commonly-owned U.S. pat. app. Ser. No. UNKNOWN, entitled "Non-Volatile Content Addressable Memory", incorporated by reference above. FIG. 4 shows one such Flash CAM 400 which includes an array 450 of substantially identical 4-T non-volatile CAM cells 210. Flash CAM 400 also includes a row control block 460 that couples to word-lines 220 and match-lines 230, sense amplifier blocks 480 that couple to match-lines 230, and bit-line drivers 201–204 that couple to bit-lines 241–244, respectively. Input partitioning logic 205 is coupled between bit-line drivers 201–204 and input signals A, $\bar{A}$, B, and $\bar{B}$. Each of N input partitioning logic 205 is associated with one of N 4-T CAM cells 210 and one of N sets of input signals $A_i$, $\bar{A}_i$, $B_i$, $\bar{B}_i$. Input signals $A_i$, $\bar{A}_i$, $B_i$, and $\bar{B}_i$ are selected from a selection circuit (not shown) depending on the bit-pair to be stored or searched in a corresponding CAM cell 210. Row control block 460 controls the voltages on word-lines 220 and match-lines 230 for erase, program, read, and search operations. Row control block 460 typically includes an address decoder (not shown) that selects a row of CAM cells 210 according to an address signal ADRIN identifying a row for a write or read operation. Bias circuits (not shown) in block 460 apply voltages to selected and unselected word-lines 220 and match-lines 230 as required for the different operations.

Sense amplifier blocks 480 sense current or voltage drops on match-lines 230 that identify stored words that do not match an input value. Bit-line drivers 201–204 control the voltages on bit-lines 241–244 for erase, program, search, and read operations. Bit-line drivers 201–204 each include tri-state drivers (not shown), with the output of each of the tri-state drivers coupled to a corresponding bit-line 241–244 in array 450. When the input to a tri-state driver is low, that driver is off and the corresponding bit-line is grounded. When the input to a tri-state driver is high, that driver is on and applies an appropriate program voltage (e.g., Vw) higher than supply voltage Vcc or search voltage (e.g., Vcc) to the corresponding bit-line. The illustrated blocks 460 and 480 can be implemented using circuits and techniques well known for non-volatile memories.

During a search, a match for a CAM word occurs when all of the CAM cells 210 in the row corresponding to the CAM word find a match so that none of the CAM cells 210 discharge the voltage on the match-line 230. A priority encoder 485 interprets the match signals from sense amplifier blocks 480 and generates an output signal ADROUT corresponding to the word in CAM 400 which matches the input value. When multiple CAM words match the input value, priority encoder 485 selects and outputs signal ADROUT corresponding to the CAM word that has the highest priority, followed by the CAM word that has the next highest priority, and so on until the last matching CAM word is identified.

Optional read circuitry 495 can be connected to bit-lines 241–244 for a parallel read operation. Read circuitry 495 includes, for example, bit-line bias circuits and sense amplifiers that couple to bit-lines 241–244. A bit-line bias circuit biases or charges an attached bit-line for reading (e.g., to about 1.5 volts) while block 460 biases a selected word-line 220 to voltage Vcc and grounds match-lines 230 and unselected word-lines 220. The bit-line sense amplifiers in read circuitry 495 sense currents or voltage drops on the attached bit-lines for a fast parallel read-out of a word from CAM 400. The parallel read operation is typically faster and more convenient for testing of CAM 400 and other product or architectural uses.

Further, Flash CAM 400 can include a CAM buffer 490 capable of a fast write operation. In an exemplary embodiment, CAM buffer 490 is a SRAM-based CAM including storage for at least one word. Alternatively, a DRAM-based CAM buffer could be used, but DRAM requires overhead for refresh operations. Such refresh circuitry is typically not warranted for the small amount of storage in CAM buffer 490. In another embodiment, CAM buffer 490 includes non-volatile CAM cells that are pre-erased in anticipation of the initiation of a write operation. In an application of CAM 400 where writing is relatively infrequent, erase operations for non-volatile cells in buffer 490 can be performed in the background of operation of CAM 400. With pre-erased rows, writing to CAM buffer 490 only requires programming of CAM cells, and does not need to wait for the erase operation to complete.

A write operation to CAM 400 temporarily stores an input word in CAM buffer 490 while a row of non-volatile array 450 is erased and subsequently programmed. Writing to CAM buffer 490 is fast when compared to the writing operations for non-volatile CAM array 450 which requires an erase operation prior to programming. With CAM buffer 490 holding a value to be written in array 450, CAM 400 can perform a search while the write operation erases a word in non-volatile array 450. In particular, as mentioned above, biasing bit-lines 241–244 for a search does not disturb an erase operation. Similarly, row control block 460 biases the word-line 220 and match-line 230 of a selected row or rows for the erase operation while biasing word-lines 220 and match-lines 230 for every other row of array 450 for the search. Simultaneously with the search in non-volatile array 450, CAM buffer 490 searches temporarily stored values for a match, and a signal from CAM buffer 490 indicates whether the input value matches a word being written.

Priority encoder 485 accepts match signals from both array 450 (via sense amplifier blocks 480) and CAM buffer 490, which includes a sense amplifier block (not shown). If any row that is not being erased contains a word matching the input value, the associated sense amplifier block 480 signals to priority encoder 485, and priority encoder 485 handles the match signals from sense amplifier blocks 480 in the same manner as described for searches without simultaneous erase operations. Each sense amplifier block 480 that corresponds to a row being erased is disabled or ignored. If CAM buffer 490 signals that the word being written matches the input value, priority encoder 460 sets output signal ADROUT corresponding to the row to which the word is being written. For multiple matches, priority encoder 485 can sequentially output signal ADROUT according to a predetermined order for the CAM words such as according to the binary addressing order.

In FIG. 4, CAM buffer 490 couples to bit-lines 241–244. This connection can be used during a search if the storage convention for the CAM cells of CAM buffer 490 are consistent with the signals on bit-lines 241–244 during a write operation. In other words, CAM buffer 490 has to use the same input partitioning scheme as array 450. However, CAM buffer 490 can be separate from array 450 and include its own write and match circuits. As indicated above, memory 400 is capable of back-to-back write and search operations since array 450 and buffer 490 can perform a search while a row of array 450 is being erased. Similarly, CAM 400 can simultaneously or sequentially erase multiple rows for back-to-back write operations with CAM buffer 490 storing the words to be written to array 450 when the corresponding rows in CAM array are ready for programming.

FIGS. 5–9 show other CAMs that can be used with the input partitioning logic of the present invention. Additional details of the CAMs of FIGS. 5–9 can be found in the above-referenced U.S. Pat. App. "Non-Volatile Content Addressable Memories". FIG. 5 shows a non-volatile CAM 500 that includes an array 550 of CAM cells 510, each CAM cell 510 including a pair of floating-gate transistors 211–214 sharing a common match-line 530. As with CAM 400 of FIG. 4, bit-line drivers 201–204 apply the appropriate voltages to corresponding bit-lines 241–244 based on input partitioning logic 205. Transistors 211–214 connect to a word-line 520 or 525 and bit-lines 241–244. CAM array 550 differs from CAM array 450 of FIG. 4 in that two adjacent rows of CAM cells 510 share a single match-line 530. The sharing of match-lines 530 between two adjacent CAM words can significantly reduce the silicon area required for forming CAM 500 as an integrated circuit, but only half of the rows of CAM cells 510 in array 550 can perform a search at one time. Thus, a search operation in CAM 500 takes two cycles. The search can stop after the first cycle if a match is found. Alternatively, match results from the first cycle of the search can be stored in latches 581. During a second cycle of the search, the states of match-lines 530 indicate whether any odd-numbered row of array 550 contains a match to the input value. The results from both cycles of the search can be applied to priority decoder 585 either directly or through latches 581.

FIG. 6 illustrates a non-volatile CAM 600 that includes an array 650 of CAM cells 610 having split word-lines. Each CAM cell 610 includes a pair of floating-gate transistors 611 and 612 and a pair of floating-gate transistors 613 and 614 which have sources coupled to the same match-line 230. The drains of transistors 611–614 respectively couple to bit-lines 641–644, and the control gates of transistors 611 and 613 and of transistors 612 and 614 couple to respective word-lines 621 and 622. Appropriate voltages are applied to bit-lines 641–644 based on signals provided to bit-line drivers 201–204 from input partitioning logic 205. In operation, a row control block 660 biases word-lines 621 and 622 in a row of CAM cells 610 to the same voltage so that word-lines 621 and 622 effectively operate as a single word-line that is split and coupled to control gates of floating-gate transistors in adjacent rows. Since transistors in adjacent rows, which share a match-line 230, are associated with the same CAM word, a single cycle search is sufficient for CAM 600. Furthermore, since the match-line is shared between two adjacent rows of CAM cells, the silicon or layout overhead is minimized.

FIG. 7 shows a CAM 700 including an array 750 of CAM cells 710 with shared-floating-gate (SFG) devices 711–714, as described in above-referenced U.S. Pat. App. "Non-Volatile Content Addressable Memories". CAM cell 710 includes four SFG devices 711–714. Each SFG device 711–714 includes a pair of floating-gate transistors which have floating gates and sources connected or coupled together. The sources of each transistor connect to a match-line 730, and the control gates of each transistor connect to a word-line 720. The drains of one transistor in each SFG device 711–714 couple to respective bit (or search)-lines 741–744, and the drains of the other transistor in each SFG device 711–714 couple to respective program-lines 745–748. A column control block 770 is coupled between input partitioning logic 205 and bit-lines 741–744 and program-lines 745–748. Column control block 770 includes program or write circuits, column decoders, and tri-state drivers for selecting and applying the appropriate voltages to bit-lines 741–744 for searches and program-lines 745–748 for programming. CAM 700 also includes row control block 460 which controls biasing of word-lines 720 and match-lines 730, sense amplifier blocks 480 coupled to match-lines 730, CAM buffer 490, read circuits 495, and priority encoder 485 which couples to sense amplifier blocks 480 and CAM buffer 490. Because SFG CAM cells 711–714 have separate bit (or search)-lines 741–744 and program-lines 745–748, CAM 700 containing an array of SFG CAM cells 710 can perform a search operation simultaneously with an erase and/or a programming operation. An array of SFG CAM cells with the architecture described herein can also use a CAM buffer to permit immediate back-to-back write and search operations without delays for either an erase operation or a delay for a programming operation.

FIG. 8 shows a non-volatile CAM 800 including an array 850 of dual CAM cells 810. Array 850 is structurally the same as array 550 of FIG. 5, but each CAM cell 810 contains two 4-T CAM cells 510 of array 550. Thus, each CAM cell 810 is an effective 8-T CAM cell that couples to associated bit-lines 241–244, associated word-lines 820 and 825, and a match-line 830. In each CAM cell 810, a first four of floating-gate transistors 811–814 have control gates coupled to word-line 820 and sources coupled to match-line 830. Respective drains of floating-gate transistors 811–814 connect to respective bit-lines 241–244. A second four of floating-gate transistors 815–818 have control gates coupled to word-line 825 and sources coupled to match-line 830. Respective drains of floating-gate transistors 815–818 connect to respective bit-lines 241–244. Input partitioning logic 205 and bit-line drivers 201–204 couple to bit-lines 241–244, respectively. Similar to other described CAMs above, a row control block 860, read circuit 895, and buffer 890 are connected to array 850.

CAM 800 allows selective masking for a single CAM word, multiple CAM words, or all CAM words in array 850, and the masking implemented for one CAM word can be different from the masking for another CAM word. In particular, a mask select register (not shown) connected to row control block 860 has one mask register bit per CAM word. During a search operation, each mask register bit controls whether row control block 860 applies supply voltage Vcc to word line 820 or 825 in the row of array 850 that corresponds to the bit. Thus, each bit in a CAM word is individually maskable by appropriate programming of the transistors 815–818 in the CAM cells 810 associated with the bit. Masking of a bit does not destroy the original value in CAM array 850 because transistors 811–814 remain in threshold voltage states that indicate the original bit. Masking one bit does not affect other bits on the same word line, which may or may not need masking. An array of dual CAM cells with the architecture described herein can also use a volatile CAM buffer to permit simultaneous erase and searches.

FIG. 9 shows a non-volatile CAM 900 including an array 950 of non-volatile dual CAM cells 910. Each dual CAM cell 910 is an 8-T CAM cell including floating-gate transistors 911–918. Each transistor 911–918 has a drain coupled to a shared drain-line 930. Transistors 911–914 have sources coupled to a word/match-line 921, and transistors 915–918 have sources coupled to a word/match-line 922. Control gates of transistors 911 and 915 couple to bit-line 141, control gates of transistors 912 and 916 couple to bit-line 142, control gates of transistors 913 and 917 couple to bit-line 143, and control gates of transistors 914 and 918 couple to bit-line 144. With these connections, transistors 911–914 form a first CAM element having the same structure as that of the conventional 4-T Flash CAM cell in FIG. 1B, except that the roles of the source and drains of the transistors are reversed. Similarly, transistors 915–918 form a second CAM element having the same structure as the first CAM element. Input partitioning logic 205 couples to tri-state drivers 201–204, which apply the appropriate voltages to bit-lines 141–144, respectively.

A row control block 960 selects desired word/match-lines 921 and 922 based on signal ADRIN and applies proper voltages for the desired operation. Sense amplifiers 981 and 982 sense which word/match-lines 921 and 922, respectively, couple to conductive transistors. Without masking, priority encoder 985 uses signals from sense amplifiers 981 to generate the output signal ADROUT identifying a matching CAM word. For a search with masking, priority encoder 985 uses signals from sense amplifiers 982 to generate output signal ADROUT. Selection of sense amplifier 981 or 982 and match-line 921 or 922 for a search can be on a row-by-row (or CAM word-by-CAM word) basis. In particular, a mask register includes one mask register bit (MRB) 996 per CAM word and applies each bit 996 to a corresponding 2:1 multiplexer 984 as a select signal. Accordingly, the match signals to priority encoder 985 indicate matches with programmable combination of matches with masked and unmasked CAM words.

It should be noted that although the above description has focused on arrays based on the 4-T CAM cell 210 of FIG. 2, other 4-T CAM cells are also suitable with the present invention, such as, but not limited to, the two 2-T CAM cell 150 described above with respect to FIG. 1B. FIG. 10 shows an AND input partitioning logic used in conjunction with CAM cell 150. AND input partitioning logic includes four two-input AND gates 1010 coupled to corresponding bit-line drivers 101–104, which are coupled to bit-lines 141–144, respectively. Each of four distinct pairs of input signals A and B and their complements are input to AND gates 1010. Depending on the value of signals A and B, a unique set of signals are applied to bit-line drivers (BLDs) 101–104, as shown in Table 9.

TABLE 9

| AB | signal to BLD 101 (A*B) | signal to BLD 102 ($\overline{A}$*B) | signal to BLD 103 (A*$\overline{B}$) | signal to BLD 104 ($\overline{A}$*$\overline{B}$) |
|---|---|---|---|---|
| 00 | Low | Low | Low | High |
| 01 | Low | High | Low | Low |
| 10 | Low | Low | High | Low |
| 11 | High | Low | Low | Low |

As seen from Table 9, the input to one distinct bit-line driver is high for each of the four AB bit-pair combinations, thereby allowing transistors attached to a particular bit-line driver to be programmed or searched corresponding to one of the four bit-pair combinations, as with the above-described partitioning logic. Thus, according to one convention, transistor 114 (attached to BLD 104) being programmed indicates 00 stored in CAM cell 150, transistor 112 (attached to BLD 102) being programmed indicates 01 stored in CAM cell 150, transistor 113 (attached to BLD 103) being programmed indicates 10 stored in CAM cell 150, and transistor 111 (attached to BLD 101) being programmed indicates 11 stored in CAM cell 150. Searches for bit-pairs 00, 01, 10, and 11 are also accomplished with input partitioning logic, similar to that described above with CAM cell 210, except that the signals applied to bit-lines 141–144 are "opposite" to that applied to bit-lines 241–244. For example, during a search for 00, Vcc is applied to bit-lines 241–243 and ground is applied to bit-line 244 when using CAM cell 210 (see Table 4), while ground is applied to bit-lines 141–143 and Vcc is applied to bit-line 144 using CAM cell 150. Table 10 below summarizes stored and input search bits and some of the parameters when using CAM cell 150 during a search.

voltages using CAM cell 150 toggle only twice between any two search patterns for a stored bit-pair. Therefore, the benefits of the present invention are also realized with input partitioning logic applied to conventional non-volatile Flash CAM cells, such as CAM cell 150.

In addition to non-volatile CAM arrays, input partitioning logic of the present invention can also be used with volatile CAM arrays comprised of dynamic random accessed memory (DRAM) cells, such as the DRAM CAM cell 1100 shown in FIG. 11. Two transistors 1111 and 1112 are coupled together via capacitors C1 and C2 from a drain of one to a source of the other. The other source and drain terminal of transistors 1111 and 1112 are coupled to respective bit-lines 1141 and 1142. A transistor 1150 is connected as a diode between a match-line 1130 and the common drain of transistors 1115 and 1116, which have sources connected to bit-lines 1141 and 1142. The gates of transistors 1111 and 1112 are connected to a word-line 1120. Capacitors C1 and C2 store the charge, which represent the data (on bit-lines 1141 and 1142) written by transistors 1111 and 1112, respectively. The other terminals of C1 and C2 are connected to a signal CP, which can be either at a "1" or a "0" level.

A "1", "0", or "don't care" state is stored as charge on capacitors C1 and C2. This charge is stored during a write operation by respective transistors 1111 and 1112. During a write operation, word-line 1120 is raised to a "high" level. To store a "1" in DRAM cell 1100, bit-line 1141 is raised to a "high" level and bit-line 1142 is at a "low" level. The high potential on bit-line 1141 charges the gate of transistor 1115 through transistor 1111, i.e., node A is charged high, and the data is thereby stored as a charge on capacitor C1. Similarly, the "low" level (e.g., ground potential) on bit-line 1142 causes the gate of transistor 1116 to discharge to a low level through transistor 1112, i.e., node B is discharged low, thereby discharging capacitor C2. When transistors 1111 and 1112 are subsequently turned off by a low signal on word-line 1120 at the end of a write operation, the charge is

TABLE 10

| Stored Data Pair/ Input Data Pair | Vt for 111 | Vt for 112 | Vt for 113 | Vt for 114 | BL 141 Volt | BL 142 Volt | BL 143 Volt | BL 144 Volt | ML 130 | Match ? |
|---|---|---|---|---|---|---|---|---|---|---|
| 00/00 | Low | Low | Low | High | 0 | 0 | 0 | Vcc | High | Yes |
| 00/01 | Low | Low | Low | High | 0 | Vcc | 0 | 0 | Low | No |
| 00/10 | Low | Low | Low | High | 0 | 0 | Vcc | 0 | Low | No |
| 00/11 | Low | Low | Low | High | Vcc | 0 | 0 | 0 | Low | No |
| 01/00 | Low | High | Low | Low | 0 | 0 | 0 | Vcc | Low | No |
| 01/01 | Low | High | Low | Low | 0 | Vcc | 0 | 0 | High | Yes |
| 01/10 | Low | High | Low | Low | 0 | 0 | Vcc | 0 | Low | No |
| 01/11 | Low | High | Low | Low | Vcc | 0 | 0 | 0 | Low | No |
| 10/00 | Low | Low | High | Low | 0 | 0 | 0 | Vcc | Low | No |
| 10/01 | Low | Low | High | Low | 0 | Vcc | 0 | 0 | Low | No |
| 10/10 | Low | Low | High | Low | 0 | 0 | Vcc | 0 | High | Yes |
| 10/11 | Low | Low | High | Low | Vcc | 0 | 0 | 0 | Low | No |
| 11/00 | High | Low | Low | Low | 0 | 0 | 0 | Vcc | Low | No |
| 11/01 | High | Low | Low | Low | 0 | Vcc | 0 | 0 | Low | No |
| 11/10 | High | Low | Low | Low | 0 | 0 | Vcc | 0 | Low | No |
| 11/11 | High | Low | Low | Low | Vcc | 0 | 0 | 0 | High | Yes |

As seen from comparing Tables 4 and 10, in order to achieve a "match", programming voltages (which correspond to the threshold voltage) and search voltages applied to the bit-lines are of the same polarity when using CAM cell 210 of FIG. 2, while programming and search voltages are of the opposite polarity when using CAM cell 150 of FIG. 1B. However, similar to using CAM cell 210, bit-line trapped or stored on capacitors C1 and C2 at nodes A and B, respectively. This storage convention stores a "0" in DRAM CAM cell 1100 when node A is low and node B is high and stores a "1" in DRAM CAM cell 1100 when node A is high and node B is low. Masking occurs when both nodes A and B are at a low potential, resulting in a "don't care" state.

Because the data in the CAM cell is stored on capacitors, the cell needs to be "refreshed" periodically due to leakage from the capacitors, which can cause errors in reading the data. Refresh cycles, as are well known, maintain proper voltage levels at nodes A and B to ensure the levels correspond to desired values of "1" and "0" when read. During a refresh cycle, bits stored in a word are read and rewritten, i.e., charge is stored on capacitors C1 and C2 by transistors 1111 and 1112, respectively, as determined by the read operation. The frequency of refresh cycles depends on various factors, such as the leakage characteristics at nodes A and B and the capacitance value of capacitors A and B. When a refresh operation is taking place, a search operation cannot be performed. Consequently, an on-chip refresh controller (not shown) typically "arbitrates" between when the DRAM CAM cell is performing refresh, search, and write operations.

A search operation biases match-line 1130 with a low-current, voltage source and applies complementary binary signals to bit-lines 1141 and 1142 to represent the bits of an input value. If bit-line 1141 is high and node A is high, no current flows through transistor 1115 because of the high potential at both the source and the drain of transistor 1115, thereby preventing discharge of the voltage on the match-line 1130. In this situation, bit-line 1142 is low and node B is low, which results in transistor 1116 being off, thereby preventing match-line 1130 from being pulled low by bit-line 1142. This results in a "match". If node A is low and node B is high, with bit-line 1141 low and bit-line 1142 high, no current flows to match-line 1130 because both transistors 1115 and 1116 are off. Thus, match-line 1130 is again prevented from discharging voltage. This also results in a "match". However, if node A is high and bit-line 1141 is grounded, and node B is low and bit-line 1142 is high, voltage on match-line 1130 is discharged via transistors 1115 and 1150. This voltage drop on match-line 1130 indicates a mismatch between the stored data and the input search data. A similar situation occurs when node A is low, bit-line 1141 is high, node B is high, and bit-line 1142 is grounded, where voltage on match-line 1130 is discharged via transistors 1116 and 1150, indicating a "mismatch". In a "don't care" state, indicated by an "X", the voltage at nodes A and B are both low, which leaves transistors 1115 and 1116 turned off, thereby preventing current flow through the transistors to discharge match-line 1130. Consequently, a match is indicated regardless of the input data on the complementary bit-lines 1141 and 1142. Table 11 below indicates the possible combinations of stored and input data bits and some of the parameters of DRAM CAM cell 1100 during a search.

TABLE 11

| Stored Data Bit/ Input Data Bit | voltage at node A | voltage at node B | voltage at BL 1141 | voltage at BL 1142 | voltage at ML 1130 | Match ? |
|---|---|---|---|---|---|---|
| 0/0 | Low | High | Low | High | High | Yes |
| 0/1 | Low | High | High | Low | Low | No |
| 1/0 | High | Low | Low | High | Low | No |
| 1/1 | High | Low | High | Low | High | Yes |

TABLE 11-continued

| Stored Data Bit/ Input Data Bit | voltage at node A | voltage at node B | voltage at BL 1141 | voltage at BL 1142 | voltage at ML 1130 | Match ? |
|---|---|---|---|---|---|---|
| X/0 | Low | Low | Low | High | High | Yes |
| X/1 | Low | Low | High | Low | High | Yes |

Transistor 1150, acting as a diode, minimizes unwanted parasitic current paths between memory cells of an array. If match-line 1130 were directly coupled to the drains of transistors 1115 and 1116, a transistor (1115 or 1116) which draws current when a mismatch occurs might draw current through a transistor(s) from another bit-line(s) of another CAM cell(s) connected to the same match-line 1130. For example, without transistor 1150, current might flow from a bit-line that is at a high potential coupled to an adjacent DRAM CAM cell (i.e., adjacent transistor), through match-line 1130 and up to a transistor coupled to a mismatched DRAM CAM cell coupled to a bit-line at a low potential. This results in excessive current flow and reduced voltage swing on match-line 1130, which can adversely affect search operations. However, with transistor 1150 acting as a diode connected between match-line 1130 and transistors 1115 and 1116, reverse current is prevented from flowing through adjacent transistors.

Similar to the 2-T non-volatile Flash CAM cell 100 of FIG. 1A, DRAM CAM cell 1100 can be combined with another DRAM CAM cell for storing and searching pairs of data bits. However, as with the two 2-T CAM cell 150 of FIG. 1B, searching pairs of data bits stored in the DRAM CAM cell requires up to four voltage transitions on the four bit-lines between searches. Therefore, the DRAM CAM cell storing pairs of data bits is subject to the similar large A.C. power consumption requirements as with the two 2-T Flash CAM cell 150 of FIG. 1B, described above. By applying an input partitioning logic to the DRAM CAM cell, power consumption can be substantially reduced.

FIG. 12 shows two DRAM CAM cells 1100 forming a DRAM CAM cell 1210 for storing and searching pairs of data bits. CAM cell 1210 includes transistors coupled to four respective bit-lines 1241–1244. Input partitioning logic 1205, according to one embodiment, includes four two-input OR gates coupled to bit-line drivers 1201–1204, which are coupled to respective bit-lines 1241–1244. The OR input partitioning logic is discussed above in conjunction with Table 6. Each of four distinct pairs of input signals A and B and their complements are input to partitioning logic 1205. Depending on the value of signals A and B, a unique set of signals are applied to bit-line drivers (BLDS) 1201–1204 to store a corresponding unique set of four voltages at nodes A, B, C, and D. For example, for storing bit pair 00 (i.e., AB=00), a low signal is applied to bit-line 1241 and high signals are applied to bit-lines 1242–1244, which stores respective low, high, high, and high voltages at nodes A, B, C, and D. Searching is performed similarly, Table 12 shows the possible combinations of stored and input search bits and some of the parameters of DRAM CAM cell 1210 during a search using OR partitioning logic.

TABLE 12

| Stored Pair/ Input Pair | node A volt | node B volt | node C volt | node D volt | BL 1241 volt | BL 1242 volt | BL 1243 volt | BL 1244 volt | ML 1230 | Match ? |
|---|---|---|---|---|---|---|---|---|---|---|
| 00/00 | Low  | High | High | High | 0    | High | High | High | High | Yes |
| 00/01 | Low  | High | High | High | High | High | 0    | High | Low  | No  |
| 00/10 | Low  | High | High | High | High | 0    | High | High | Low  | No  |
| 00/11 | Low  | High | High | High | High | High | High | 0    | Low  | No  |
| 01/00 | High | High | Low  | High | o    | High | High | High | Low  | No  |
| 01/01 | High | High | Low  | High | High | High | 0    | High | High | Yes |
| 01/10 | High | High | Low  | High | High | 0    | High | High | Low  | No  |
| 01/11 | High | High | Low  | High | High | High | High | 0    | Low  | No  |
| 10/00 | High | Low  | High | High | 0    | High | High | High | Low  | No  |
| 10/01 | High | Low  | High | High | High | High | 0    | High | Low  | No  |
| 10/10 | High | Low  | High | High | High | 0    | High | High | High | Yes |
| 10/11 | High | Low  | High | High | High | High | High | 0    | Low  | No  |
| 11/00 | High | High | High | Low  | 0    | High | High | High | Low  | No  |
| 11/01 | High | High | High | Low  | High | High | 0    | High | Low  | No  |
| 11/10 | High | High | High | Low  | High | 0    | High | High | Low  | No  |
| 11/11 | High | High | High | Low  | High | High | High | 0    | High | Yes |

As seen from Table 12, only two transitions occur on the bit-lines during searches, thereby reducing power consumption, similar to the discussion above with respect to Flash CAM cells.

Table 13 summarizes bit-line voltages for some of the CAM cells described above for writing and searching bit-pairs 00, 01, 10, and 11, where the columns identify the bit-lines that are high (unless otherwise indicated) for the corresponding write and search operations for each bit-pair.

TABLE 13

|   | encoding w/cell 150 | encoding w/cell 210 | encoding w/cell 1210 | no encoding w/cell 150 | no encoding w/ cell 210 | no encoding w/cell 1210 |
|---|---|---|---|---|---|---|
| write |   |   |   |   |   |   |
| 00 | 144 | 244 | 1241 (low) | 142, 144 | 242, 244 | 1242, 1244 |
| 01 | 142 | 242 | 1243 (low) | 142, 143 | 242, 243 | 1242, 1243 |
| 10 | 143 | 243 | 1242 (low) | 141, 144 | 241, 244 | 1241, 1244 |
| 11 | 141 | 241 | 1244 (low) | 141, 143 | 241, 243 | 1241, 1243 |
| search |   |   |   |   |   |   |
| 00 | 144 | 244 (low) | 1241 (low) | 142, 144 | 242, 244 (low) | 1242, 1244 |
| 01 | 142 | 242 (low) | 1243 (low) | 142, 143 | 242, 243 (low) | 1242, 1243 |
| 10 | 143 | 243 (low) | 1242 (low) | 141, 144 | 241, 244 (low) | 1241, 1244 |
| 11 | 141 | 241 (low) | 1244 (low) | 141, 143 | 241, 243 (low) | 1241, 1243 |

As seen from Table 13, for write and search operations (both for data encoding and no encoding), the polarity of voltages applied to the bit-lines are the same for CAM cell 150 and DRAM CAM cell 1210, and are the opposite for CAM cell 210. Thus, when utilizing CAM cell 210, tri-state drivers must also be able to invert the polarity of signals applied between search and write operations.

Although the invention has been described with reference to particular embodiments, the description is only an example of the invention's application and should not be taken as a limitation. Various other adaptations and combinations of features of the embodiments disclosed are within the scope of the invention as defined by the following claims.

I claim:

1. A content addressable memory (CAM) comprising:

a CAM cell for storing two bits of data, the CAM cell having four transistors, each transistor being coupled to one of four corresponding bit-lines; and input partitioning logic-coupled to the four bit-lines, wherein the input partitioning logic applies to the four bit-lines one of four unique sets of signals for each of four input signal combinations, and wherein the four sets of signals differ from each other by at most two out of the four signal positions.

2. The CAM of claim 1, wherein the input signal combinations are represented by the four bit-pairs of binary signals A and B and their complements.

3. The CAM of claim 1, further comprising a mask register coupled to the input partitioning logic, wherein whenever the mask register applies a first signal to the input partitioning logic, each of the four bit-lines is supplied a programming voltage to program each of the four transistors to a "don't care" state.

4. The CAM of claim 1, further comprising a mask register coupled to the input partitioning logic, wherein whenever the mask register applies a first signal to the input partitioning logic, each of the four bit-lines is supplied a search voltage to prevent any of the four transistors from conducting regardless of the threshold voltages of the four transistors.

5. The CAM of claim 1, wherein the CAM cell comprises:
   a first non-volatile device having a control gate coupled to a first one of the bit-lines, a drain coupled to a match/word-line, and a source coupled to a source-line;
   a second non-volatile device having a control gate coupled to a second one of the bit-lines, a drain coupled to the match/word-line, and a source coupled to the source-line;
   a third non-volatile device having a control gate coupled to a third one of the bit-lines, a drain coupled to the match/word-line, and a source coupled to the source-line; and
   a fourth non-volatile device having a control gate coupled to a fourth one of the bit-lines, a drain coupled to the match/word-line, and a source coupled to the source-line.

6. The CAM of claim 1, further comprising masking logic coupled to the input partitioning logic, wherein programming voltages are supplied to selected ones of the four-bit lines to program a selected pair of transistors to a "don't care" state.

7. The CAM of claim 1, further comprising masking logic coupled to the input partitioning logic, wherein search voltages are supplied to selected ones of the four bit-lines to prevent a corresponding transistor from conducting regardless of the threshold voltage of the transistor.

8. The CAM of claim 7, wherein the input partitioning logic comprises four two-input AND gates, each AND gate coupled to a corresponding one of the four bit-lines, and wherein the masking logic comprises two two-input OR gates coupled to each of the four AND gates, each OR gate having an input coupled to a bit of data and another input coupled to a masking bit for one of the two bits of data.

9. The CAM of claim 1, further comprising bit-line drivers coupled between each of the four bit-lines and the input partitioning logic.

10. The CAM of claim 9, wherein the bit-line drivers are tri-state bit-line drivers.

11. The CAM of claim 9, wherein each of four combinations of the two bits of data stored in the CAM cell is searched when one of the bit-lines is at approximately ground and the remaining three of the bit-lines are at approximately the supply voltage.

12. The CAM of claim 1, wherein the CAM cell comprises:
   a first non-volatile device having a control gate coupled to a word-line, a drain coupled to a first one of the bit-lines, and a source coupled to a match-line;
   a second non-volatile device having a control gate coupled to the word-line, a drain coupled to a second one of the bit-lines, and a source coupled to the match-line;
   a third non-volatile device having a control gate coupled to the word-line, a drain coupled to a third one of the bit-lines, and a source coupled to the match-line; and
   a fourth non-volatile device having a control gate coupled to the word-line, a drain coupled to a fourth one of the bit-lines, and a source coupled to the match-line.

13. The CAM of claim 12, wherein each non-volatile device comprises a floating-gate transistor.

14. The CAM of claim 12, wherein each non-volatile device comprises a Flash memory cell.

15. The CAM of claim 12, wherein each non-volatile device comprises a shared-floating-gate device.

16. The CAM of claim 1, wherein the input partitioning logic comprises four two-input logic gates, the output of each logic gate coupled to a corresponding one of the four bit-lines.

17. The CAM of claim 16, wherein the logic gates are selected from the group consisting of NAND and OR gates.

18. The CAM of claim 17, wherein each of four combinations of the two bits of data stored in the CAM cell are represented by one of the transistors in a high threshold voltage state and the remaining three of the transistors in a low threshold voltage state.

19. The CAM of claim 16, wherein the logic gates are selected from the group consisting of NOR and AND gates.

20. The CAM of claim 19, wherein each of four combinations of the two bits of data stored in the CAM cell are represented by one of the transistors in a low threshold voltage state and the remaining three of the transistors in a high threshold voltage state.

21. A content addressable memory (CAM) comprising:
   a CAM cell for storing two bits of data, the CAM cell comprising a first and second DRAM CAM cell, each DRAM CAM cell coupled to two of four bit-lines; and
   input partitioning logic coupled to the four bit-lines, wherein the input partitioning logic applies to the four bit-lines one of four unique sets of signals for each of four input signal combinations, and wherein the four sets of signals differ from each other by at most two out of the four signal positions.

22. The CAM of claim 21, wherein the first DRAM CAM cell comprises:
   a first transistor having a gate coupled to a word-line, a source coupled to a first one of the bit-lines, and a drain;
   a second transistor having a gate coupled to the word-line, a source coupled to the drain of the first transistor; and a drain coupled to a second one of the bit-lines;
   a third transistor having a gate coupled to the drain of the first transistor, a source coupled to the first one of the bit-lines, and a drain;
   a fourth transistor having a gate coupled to the source of the second transistor; a source coupled to the second one of the bit-lines, and a drain coupled to the drain of the third transistor;
   a diode coupled between the drains of the third and fourth transistors and a match-line; and
   a first and second capacitor coupled to the drain and source, respectively, of the first and second transistors;
   and wherein the second DRAM CAM cell comprises:
   a first transistor having a gate coupled to the word-line, a source coupled to a third one of the bit-lines, and a drain;
   a second transistor having a gate coupled to the word-line, a source coupled to the drain of the first transistor; and a drain coupled to a fourth one of the bit-lines;
   a third transistor having a gate coupled to the drain of the first transistor, a source coupled to the third one of the bit-lines, and a drain;

a fourth transistor having a gate coupled to the source of the second transistor; a source coupled to the fourth one of the bit-lines, and a drain coupled to the drain of the third transistor;

a diode coupled between the drains of the third and fourth transistors and the match-line; and a first and second capacitor coupled to the drain and source, respectively, of the third and fourth transistors.

23. The CAM of claim 21, wherein the input partitioning logic comprises OR gates, the output of each OR gate coupled to a corresponding one of the four bit-lines.

24. A content addressable memory (CAM) that comprises an array of CAM cells, the array comprising:

a plurality of word-lines, each word-line being associated with a corresponding row of CAM cells in the array;

a plurality of match-lines, each match-line being associated with a corresponding row of CAM cells in the array;

a plurality of four bit-line groups, wherein each bit-line group is associated with a pair of corresponding columns of CAM cells in the array; and input partitioning logic coupled to the plurality of bit-line groups, wherein the input partitioning logic applies to each of the bit-line groups one of a set of four signal combinations, and wherein each set consists of four binary values, each set differing from every other set by at most two out of the four binary values.

25. A method for operating a content addressable memory (CAM), comprising:

encoding an input pair of data bits, wherein the encoding produces a set of four distinct signal sets;

applying signals to each of four bit-lines of a CAM cell based on the results of the encoding, wherein the signals applied are different for each of the four combinations of the input pair of data bits.

26. The method of claim 25, further comprising applying signals in which at most two out of the four voltages on the bit-lines change during a search for a pair of data bits stored in the CAM cell.

27. The method of claim 25, wherein the encoding comprises performing a logical function on the input pair of data bits, wherein the logical function is selected from a group consisting of NAND, NOR, OR, and AND functions.

28. The method of claim 27, further comprising applying a program voltage to only one of the four bit-lines, the one bit-line corresponding to one of the four input pair of data bits when the logic function is selected from the group consisting of NAND and OR functions.

29. The method of claim 27, further comprising applying a program voltage to only three of the four bit-lines, the three bit-lines corresponding to one of the four input pair of data bits when the logic function is selected from the group consisting of NOR and AND functions.

30. A method for operating a content addressable memory (CAM), comprising:

encoding an input pair of data bits;

applying a unique set of four signals to four bit-lines of a CAM cell based on the results of the encoding; and switching the voltages on at most two of the four bit-lines when searching an input pair of data bits stored in the CAM cell.

31. The method of claim 30, wherein said CAM cell is a DRAM CAM cell.

32. The method of claim 30, wherein the CAM cell is a non-volatile Flash CAM cell.

33. The method of claim 30, wherein the encoding comprises applying the pair of data bits and their complements to logic gates, each coupled to a corresponding one of the four bit-lines.

34. The method of claim 33, further comprising applying a masking signal to the logic gates so that the set of four signals are the same.

35. The method of claim 33, further comprising applying a masking signal corresponding to each of the pair of data bits to the logic gates so that at least two of the four signals are the same.

36. The method of claim 33, wherein the logic gates are selected from a group consisting of AND, OR, NOR, and NAND logic gates.

37. The method of claim 35, wherein the applying comprises applying the masking signal and the pair of data bits and their complements to OR gates, and wherein the encoding comprises applying the output of the OR gates to AND gates.

\* \* \* \* \*